US005994929A

United States Patent [19]

Sano et al.

[11] Patent Number: 5,994,929

[45] Date of Patent: Nov. 30, 1999

[54] DRIVER FOR DISPLAY PANEL

[75] Inventors: Yoshio Sano; Masataka Ohba, both of Tokyo, Japan

[73] Assignee: NEC Corporation, Tokyo, Japan

[21] Appl. No.: 09/066,981

[22] Filed: Apr. 27, 1998

[30] Foreign Application Priority Data

Apr. 25, 1997 [JP] Japan .................................. 9-122986

[51] Int. Cl.$^{6}$ ........................................ H03B 1/00

[52] U.S. Cl. ........................ 327/111; 327/110; 361/156

[58] Field of Search ............................... 327/108, 109, 327/110, 111, 379, 380; 361/154, 155, 156

[56] References Cited

U.S. PATENT DOCUMENTS

| | | | |
|---|---|---|---|
| 4,410,926 | 10/1983 | Hafner et al. | 361/93 |
| 4,707,692 | 11/1987 | Higgins et al. | 340/805 |
| 4,820,940 | 4/1989 | Wachi et al. | 327/110 |
| 5,220,467 | 6/1993 | Zucker | 360/66 |
| 5,907,465 | 5/1999 | Easter | 361/149 |

FOREIGN PATENT DOCUMENTS

| | | |
|---|---|---|
| 61-132997 | 6/1986 | Japan . |
| 63-101897 | 5/1988 | Japan . |
| 5-81912 | 11/1993 | Japan . |
| 7-295506 | 11/1995 | Japan . |
| 8-137432 | 5/1996 | Japan . |
| 8-160901 | 6/1996 | Japan . |

OTHER PUBLICATIONS

Higgins, "A Low–Power Drive Scheme for AC TELL Displays" *SID 85 Digest* pp. 226–227 (1985).

*Primary Examiner*—Timothy P. Callahan
*Assistant Examiner*—An T. Luu
*Attorney, Agent, or Firm*—Foley & Lardner

[57] ABSTRACT

A capacitive load drive is provided, which can perform faster and more efficient operation than an energy recovery circuit for effectively reducing ineffective energy of pulses applied to a capacitive load. An energy recovery circuit is connected to a first electrode of the capacitive load, to which pulses are applied. The energy recovery circuit comprises a coil and a capacitor connected in series for energy recovery, and a first and a second voltage clamp switches connected to the other terminal of the series circuit of the coil and the capacitor, the first voltage clamp switch being connected to a high voltage side terminal of the DC power supply, the second voltage clamp switch being connected to a low voltage side terminal of the DC power supply.

20 Claims, 15 Drawing Sheets

DRIVER FOR DISPLAY PANEL

BACKGROUND OF THE INVENTION

The present invention relates to drives for display panels, such as plasma display panels and electroluminecsent panels, and more particularly to capacitive load drives capable of recovering charging and discharging power of electrostatic capacitance of a display panel. More specifically, the present invention relates to energy recovering type capacitive load drives for applying pulses to capacitive loads, which is capable of operating faster than prior art systems, with less reactive power and high efficiency.

Among capacitive loads requiring pulses for driving are display panels, such as plasma display panels, electroluminescent panels and liquid crystal panels, which are used as image displays for data terminal units, personal computers and television sets.

As a typical example of the drive, one which can reduce the reactive power of a plasma display panel drive circuit will be described hereinunder.

A plasma display panel is simple in construction and readily capable of increasing its display face area. As another merit, for a substrate of the panel it is possible to use inexpensive soda glass finding extensive applications to window glasses and the like.

The plasma display panel is fabricated by using two transparent insulating substrates of soda glass or the like, forming partitioning walls partitioning electrodes or display unit pixels on the substrates, and bonding together the substrates with these structures formed thereon.

Usually, the partitioning walls have a height of about 0.1 mm, and the transparent insulating substrates have a thickness of about 3 mm. Thus, it is possible to obtain a display which is very thin and light in weight.

With the above merits, plasma display panels are about finding applications particularly to recently extremely advanced personal computers and office work stations and also large size wall televisions which are expected to be advanced.

In dependence on the panel structure, plasma displays are largely classified into a DC type and an AC type. The DC type is so called, because its electrodes are in direct contact with discharge gas, and once discharge is caused, it carries DC current continuously. In the AC type, an insulating layer intervenes between electrodes and discharge gas. In this type of plasma display, a pulse current is caused, in response to voltage application, to flow for a short period of about 1 microsecond before it is converged. In this case, the current flow is restricted by the electrostatic capacitance of the insulating layer. The insulating layer serves as a capacitor, and by AC pulse application recurring pulse light emission is caused for display. This is why the AC type is called as such.

The DC type is simple in construction. However, this type of plasma display has a drawback that electrodes are directly exposed to the discharge and therefore greatly worn out, and it is difficult to ensure long electrode life. The AC type, on the other hand, can ensure long electrode life because the electrodes are covered by the insulating layer, although the formation of the insulating layer requires extra time and expenditure. In addition, a function called memory can be readily realized, which permits high intensity light emission. Thus, development of the AC type is recently in rapid progress.

An AC memory type plasma display panel structure will now be described, and then a method of driving the panel and a prior art drive circuit will be described.

As the AC memory type plasma display panel structure, one which is shown in Japanese Laid-Open Patent Publication No. 7-295506 will now be described with reference to FIGS. 7A and 7B. The AC memory type plasma display panel structure shown in FIGS. 7A and 7B has an electrode structure of generally called surface discharge type, and is an example of display panel, to which the capacitive load drive according to the present invention is applied as will be described later in detail. FIG. 7A is a plan view, and FIG. 7B is a sectional view taken along line x-x' in FIG. 7A.

Referring to FIGS. 7A and 7B, the illustrated plasma display panel structure comprises a first insulating substrate 11 of soda glass having a thickness of about 3 mm, a second insulating substrate 12 also of soda glass having the same thickness of about 3 mm, sustained discharge electrodes 13*a* of a transparent NESA film provided on the first insulating substrate 11, scanning electrodes 13*b* of the same transparent NESA film, metal electrodes 13*c* of a thick silver film or the like provided on the transparent sustained discharge and scanning electrodes 13*a* and 13*b* for supplying sufficient current thereto, column electrodes 14 of a thick silver film or the like provided on the second insulating substrate 12, discharge gas spaces 15 filled with discharge gas composed of He and Ne in a ratio of 7:3 and also 3% of Xe and under a total pressure of 500 Torr, a thick partitioning wall structure 16 of glass provided on an insulating layer 18*a* such as to secure the discharge gas spaces and defining pixels, a phosphor 17 composed of $Zn_2SiO_4$:Mn laminated on an insulating layer 18*b* for converting ultraviolet light by discharge of the discharge gas to visible light, the insulating layer 18*a* formed as a thick film of transparent glaze covering the sustained discharge, scanning and metal electrodes 13*a*, 13*b* and 13*c*, and a protective layer 19 of MgO having a thickness of 1 $\mu$m for protecting an insulating layer 18*a* covering the electrodes 13*a*, 13*b*, 13*c* and also the insulating layer 18*a* against the discharge.

Referring to FIG. 7A, sections defined by the vertical and horizontal portions of the partitioning wall structure 16 are pixels 20.

Referring to FIG. 8, pixels at the intersections of scanning electrodes SSi (i=1, 2, . . . , m) and column electrodes DDj (j=1, 2, . . . , m) are labeled aij. By providing the phosphor 17 in FIG. 7B as red, green and blue phosphors for the individual pixels, a plasma display is obtainable which permits full color display. Display may be made on either the upper or the lower surface of the plasma display shown in FIG. 7B. In this example, suitably the display is made in the lower surface. This is so because in this case a higher aperture factor is obtained, and light-emitting phosphors can be directly viewed, i.e., a higher light intensity is obtainable.

FIG. 8 is a plan view showing only the electrodes of the plasma display panel shown in FIGS. 7A and 7B. Referring to FIG. 8, designated at 10 is the plasma display panel, at 21 a sealed section obtained by sealing together the first and second insulating substrates 11 and 12 with discharge gas sealed in the inside, at CC1, CC2, . . . , CCm the sustained discharge electrodes 13*a*, at SS1, SS2, . . . , SSm the scanning electrodes 13*b*, and at DD1, DD2, . . . , DDn the column electrodes 14.

An actual plasma display panel comprises, for instance, 480 scanning electrodes SS1, SS2, . . . , SSm, 480 sustained discharge electrodes CC1, CC2, . . . , CCm and 1,920 column electrodes DD1, DD2, . . . , DDn. The inter-pixel pitches are 0.35 mm between adjacent column electrodes and 1.05 mm between adjacent scanning electrodes. The distance between each scanning electrode and each column electrode is 0.1 mm.

A method of providing a gradation display on the above plasma display will now be described.

In the plasma display panel, unlike other devices, it is difficult to obtain high intensity gradation display by changing the applied voltage, because the applied voltage and the light intensity are not linearly related to each other. Usually, gradation display is obtained by controlling the number of light emission times. Particularly, a sub-field method to be described in the following is used for the high light intensity gradation display.

FIG. 9 is a view for describing a drive sequence in the sub-field method. In the graph, the ordinate axis is taken for scanning electrodes, and the abscissa axis is taken for time. One image frame is fed in one field. The field time varies with different computers and broadcast systems, but in many cases it is set to be in a range of 1/50 to 1/75 second.

As shown in FIG. 9, in the gradation image display on the plasma display panel, one field is divided into k sub-fields (i.e., 6 sub-fields SF1 to SF6 in the case of FIG. 9). As will be described later in connection with FIG. 10, each sub-field consists of a write time for writing data under control of preliminary discharge pulses, preliminary discharge erase pulses, scanning pulses and data pulses, and a sustained discharge time for display light emission.

The intensity of light emitted from each pixel is controlled by weighting or multiplying the number of times of the sustained discharge light emission from each pixel in each sub-field by $2^n$ as:

$$\text{Intensity} = \sum_{n=1}^{K} (L_1 \times 2^{n-1}) \times a_n$$

In formula (1), n is the serial number of the sub-field. That is, 1-st sub-field is the lowest light intensity sub-field, and k-th sub-field is the highest light intensity sub-field. L1 is the light intensity of the lowest light intensity sub-field. $a_n$ is a variable taking a value of either "1" or "0", and is "1" when light is emitted and "0" when not so in the pertinent pixel in n-th sub-field. The light intensity can be controlled by selecting whether light from each sub-field is to be "on" or "off".

FIG. 9 shows the case where k is 6. Where color display is made with a red, a green and a blue pixel as a set, gradation display $2^k=2^6=64$ gradations may be made in each color. The color display can be made in $64^3$, i.e., 262,144 different colors (including black color).

Where k is 1, one field consists of one sub-field, and two-gradation display (i.e., "on"-or-"off" display) may be made in each color.

Drive waveforms will now be described. FIG. 10 is a view showing an example of drive voltage waveforms and a light emission waveform in a sub-field in the prior art plasma display panel shown in FIGS. 7 and 8.

Referring to FIG. 10, labeled (A) is the waveform of voltage applied to the sustained discharge electrodes CC1, CC2, . . . , CCm.

Labeled (B) is the waveform of voltage applied to the scanning electrode SS1.

Labeled (C) is the waveform of voltage applied to the scanning electrode SS2.

Labeled (D) is the waveform of voltage applied to the scanning electrode SSm.

Labeled (E) is the waveform of voltage applied to the column electrode DD1.

Labeled (F) is the waveform of voltage applied to the column electrode DD2.

Labeled (G) is the waveform of light emission from pixel a11.

The shaded pulses in the waveforms (E) and (F) indicate that their presence or absence is determined by whether data to be written is present or not.

As data voltage waveforms, FIG. 10 shows the case where data is written in pixels a11 and a22. As for the pixels in the 3-rd and following lines, it is indicated that display is made in dependence on whether data is present or not.

Sustained discharge pulses 31 and preliminary discharge pulses 36 are applied to the sustained discharge electrodes CC1, CC2, . . . , CCm.

Scanning pulses 33 are applied in line sequence to the scanning electrodes SS1, SS2, . . . , SSm in independent timings in addition to common pulses, i.e., the sustained discharge pulses 32, erase pulses 35 and preliminary discharge erase pulses 37. Data pulses 34 are applied in synchronism to the scanning pulses 33 to the column electrodes DDj (j=1, 2, . . . , n) when light emission data is present.

The operation of the prior art plasma display panel shown in FIGS. 7 and 8 will now be described. The discharge of the pixels which have been "on" in the immediately preceding sub-frame are erased by an erase pulse 35. Then, forced discharge of all the pixels is caused once by a preliminary discharge pulse 36. The preliminary discharge is then erased by the preliminary discharge erase pulse 37. Now, write discharge can be readily caused by the scanning pulses which are subsequently applied.

After the preliminary discharge has been erased, write discharge is caused by applying scanning pulses 33 and data pulses 34 at the same timings between the scanning electrodes and the column electrodes. Subsequently, sustained discharge is held between each sustained discharge electrode and the associated scanning electrode by sustained discharge pulses 31 and 32.

When sole scanning pulse 33 or sole data pulse 34 is applied, no write discharge is caused, and also no subsequent sustained discharge is caused. Such a function is called memory function, and the intensity of light emitted in each sub-field is controlled by the number of times of causing the sustained discharge.

Now, the drive circuit of the prior art plasma display panel will be described with reference to FIG. 11. The circuit comprises a plasma display panel pixel group 41, a generator 42 for generating preliminary discharge pulse, a pulse generator 43 for generating the sustained discharge electrode side sustained discharge pulses 31 and including a energy recovery circuit, a pulse generator 44 for generating the scanning side erase pulses 35 and preliminary discharge erase pulses 37, a scanning pulse generator 45, and a pulse generator 46 connected via a mixer 47 to the scanning electrodes, for generating the scanning electrode side sustained discharge pulses 32 and including a energy recovery circuit. The mixer 47 mixes the scanning electrode side sustained discharge pulses and the scanning pulses. Designated at TP1 is an output terminal of the sustained discharge electrode side sustained discharge pulse generator 43 or the scanning electrode side sustained discharge pulse generator 46.

Since the electrostatic capacitance of the plasma display panel is high, a commonly termed energy recovery circuit for recovering the charging and discharging power of the electrostatic capacitance is used to recover the charging and discharging power of the sustained discharge pulses, and a circuit consuming less power is used for the sustained discharge and scanning electrode side sustained discharge pulse generators 43 and 46 (see, for instance, Japanese Laid-Open Patent Publication No. 61-132997).

The basic circuit and operation of this first prior art will now be described. FIG. 12 is a circuit diagram showing the basic construction of the prior art sustained discharge pulse generating circuit with a power recovering circuit, for generating sustained discharge pulses.

Referring to FIG. 12, the circuit comprises a DC power supply output capacitor C100, external capacitance C101 including floating capacitance in the circuit, C102 equivalent electrostatic capacitance between each scanning electrode and the associated sustained discharge electrode in the plasma display panel, high voltage side switches S100, S101, S102 and S103, diodes D100, D101, D102 and D103 and a energy recovery coil L100. Designated at TP1 is the output terminal of the sustained discharge or scanning electrode side sustained discharge pulse generator 43 or 46, and at TP2 a terminal, which a DC power supply providing sustained discharge pulse voltage (VS) is connected to.

The operation of the circuit shown in FIG. 12 will be briefly described with reference to a timing chart shown in FIG. 13. For providing the sustained discharge pulse voltage, at instant T100 the switch S103 is turned off while the switch S100 is turned on. As a result, the external capacitance C101 and the panel capacitance C102 are charged through the coil L100.

At instant T101, the voltage at the terminal TP1 exceeds the DC power supply voltage (VS) at the terminal TP2, whereupon the diode D102 is turned on to clamp the voltage at the terminal TP1 to the voltage (VS) at the terminal TP2.

If the switch S100 is held "on" at this time, current would be caused through the closed circuit of the coil L100, the diode D102 and the switch S100 by the electromotive force of the coil L100. This power would be wasted in the closed circuit. Accordingly, the switch S100 is turned off in accurate synchronism to the instant T101, at which the voltage at the terminal TP1 exceeds the voltage at the terminal TP2. Consequently, the energy having been stored in the coil L100 is recovered in the capacitor C100 connected to the terminal TP1 through the coil L100, the diode D100, the capacitor C100 and the diode D101.

At subsequent instant T101 when the voltage at the terminal TP1 exceeds the voltage at the terminal TP2, the switch S102 is closed to connect the DC power supply through the terminal TP1 and fix the voltage at the terminal TP1 the sustained voltage pulse voltage (VS).

At subsequent instant T102, the switch S102 is turned on while turning on the switch S101 to remove the sustained discharge pulse voltage. As a result, the voltage at the terminal TP1 is reduced to zero voltage through the coil L100. At subsequent instant TP1 when the voltage at the terminal TP1 becomes lower than zero voltage, the diode D103 is turned on, whereupon the voltage at the terminal TP1 is clamped to zero voltage.

If the switch S101 is held "on" at this time, current would flow through the closed circuit of the coil L100, the switch S101 and the diode D103 due to the electromotive force of the coil L101, and this power would be wasted in the closed circuit. Accordingly, the switch S101 is turned off in exact synchronism to the instant T103 when the voltage at the terminal TP1 becomes lower than zero voltage. By so doing, the energy having been stored in the coil L100 is recovered in the capacitor C100 connected to the terminal TP2 through the coil L100, the diode D100, the capacitor C100 and the diode D102.

While in this prior art positive polarity pulse voltage is generated, in the case of the prior art drive waveforms shown in FIG. 10 negative polarity pulse voltage is used. In this case, the power supply terminal TP2 may be grounded so that the grounded circuit part is connected to the negative side of the DC power supply. In this case, the external capacitance C101 and the electrostatic capacitance C102 of the panel may be equivalently grounded at one end as shown in FIG. 12 as is usual.

As described above, for efficient energy recovery it is necessary to accurately control the timings or instants of turning off the switches S100 and S101. Inaccurate timing control would increase the power loss in the energy recovery circuit and extremely deteriorate the energy recovery efficiency and, in the worst case, would result in burning of the diodes D102 and D103 and the switches S100 and S101.

The above timing control is efficient in the case of the electroluminescent panel described as an embodiment in the above Japanese Laid-Open Patent Publication No. 61-132997, in which the operation may be relatively slow. In this electroluminescent panel the rise or fall time of data pulses applied to the column electrodes is several microseconds or above. Such rise and fall time permits the use of power MOS FET elements with operation delay of about 0.1 microsecond to realize as the switches S100 and S101 those which can be held "on" for only several microseconds, a time corresponding to the above rise or fall time.

However, the situation is different with the plasma display panel or the like, which is required to perform very fast operation compared to the electroluminescent panel. In the plasma display panel, the rise or fall time of sustained discharge pulses is about 0.2 to 0.5 microsecond. A high power, high breakdown voltage switch, which can perform sufficiently fast operation (preferably with operation delay time of 0.1 microsecond or below) and can be held "on" accurately only for such short rise or fall time, is not available or expensive, if any.

Therefore, the circuit construction shown in the above Japanese Laid-Open Patent Publication No. 61-132997 cannot sufficiently meet the requirements of the plasma display panel.

Japanese Laid-Open Patent Publication No. 63-101897 and Japanese Laid-Open Patent Publication No. 8-160901 show drives of energy recovery type for supplying pulses to plasma display panels. Such drives will now be described as second prior art.

FIG. 14 is a circuit diagram showing the basic circuit in this second prior art. Referring to FIG. 14, the circuit comprises switches S11 to S14, diodes D11 to D14, a energy recovery coil L1, electrostatic capacitance of the plasma display panel as load, and a energy recovery capacitor C100 having 100 times the electrostatic capacitance C2 or more. Designated at TP1 is an output terminal of the sustained discharge or scanning electrode side sustained discharge pulse generator as shown in FIG. 11. Designated at TP2 is a terminal connected to a power supply for providing the sustained discharge pulse voltage.

This prior art circuit, like the circuit in the first prior art as shown in FIG. 11, will be described as positive polarity pulse generating circuit.

Referring to FIG. 15 which shows the operation of switches and output voltage waveform in this circuit, in the steady state of pulse supply to the plasma display panel, the terminal voltage across the capacitor C10 is approximately one half the voltage (VS) at the terminal TP2.

To cause pulse rise, the switch S14 which has been clamping the voltage at the TP1 to the ground voltage is turned off while turning on the switch S11. As a result, current is caused to flow in a series resonance state from the capacitor C10 through the switch S11, the diode D11 and the coil L1. When the voltage at the terminal TP1 becomes maximum with the resonance of the coil L1 and the electrostatic capacitance C2, the switch S13 is turned on to clamp the voltage at the terminal TP1 to the voltage at the terminal TP2, i.e., the voltage (VS) of the sustained discharge pulse voltage source.

To cause pulse fall, the switches S11 and S13 are turned off while turning on the switch S12. As a result, the voltage at the terminal TP1 is caused to fall. Like the pulse rise case, when the voltage at the terminal TP1 becomes minimum with the resonance of the coil L1 and the electrostatic capacitance C2, the switch S14 is turned on to clamp the voltage at the terminal TP1 to the ground voltage.

While it has been noted that the capacitance of the capacitor C10 is 100 times the electrostatic capacitance C2 of the panel or more, this is by no means limitative; for instance, it is sufficiently comparable with the electrostatic capacitance C2 of the panel (see, for instance, Japanese Laid-Open Patent Publication No. 8-137432.

In this second prior art, as shown in FIG. 15, the "on" time of the switches S11 and S13 need not be limited to the rise or fall time of the output pulse. More specifically, the "on" time may be extended without any operational problem up to the end of the subsequent clamp time (from instant T12 to instant T13).

It is thus possible to readily realize a plasma display panel by using prior art MOS FETs or the like even with as short rise or fall time as 0.2 to 0.5 microsecond.

In the second prior art as shown above, however, as is seen from the voltage waveform at the terminal TP1 shown in FIG. 15, a jump voltage ΔV is always caused when the clamp circuit is turned on at the rising and falling of pulse (i.e., at instants T12 and T14) due to power loss in the energy recovery circuit, which is constituted by power MOS FETs or the like having finite "on" resistance.

Therefore, at the instants T12 and T14 a rash current is caused through the clamp circuit, resulting in power loss in the switches S13 and S14 and also noise generation.

Japanese Laid-Open Patent Publication No. 8-152865 discloses a drive of energy recovery type which supplies pulses to a plasma display panel. This drive will now be described as third prior art. FIG. 16 is a block diagram showing the basic construction of the third prior art.

Referring to FIG. 16, a sustained discharge electrode side sustained discharge pulse generator 48 is used in lieu of the sustained discharge and scanning electrode side sustained discharge pulse generators 43 and 46 used in the prior art shown in FIG. 11. Designated at TP21 and TP22 are output terminals of the sustained discharge pulse generator 48.

FIG. 17 is a circuit diagram showing the sustained discharge pulse generator 48. Referring to FIG. 17, designated at TP3 is a terminal connected to a power supply for supplying the sustained discharge pulse voltage, at TP21 and TP22 sustained discharge pulse output terminals as shown in FIG. 16, at S21 to S26 switches for clamping the voltages between the output terminals TP21 and TP22 to the ground voltage or the sustained discharge pulse voltage, at S25 and S26 energy recovery switches, at L21 a energy recovery coil, and at D25 and D26 energy recovery diodes.

This third prior art, unlike the preceding first and second prior arts, will be described as a circuit which generates negative polarity sustained discharge pulses.

Referring to FIG. 18, which is a waveform chart illustrating operation of switches and showing output voltage waveform of the circuit, at instant T20 the switches S21 and S24 are "on" while the switch S25 is "off". Also, a negative polarity sustained discharge pulse voltage (−VS) prevails at the terminal TP22.

When the switches S21, S24 and S25 are turned off while the switch 26 is turned on at subsequent instant T21, the electrostatic capacitance C2 of the panel turns to be discharged through the switch S26, the diode D26 and the coil L21, thus causing resonant current through this circuit.

When the resonant current has been ended, the voltage at the terminal TP22 rises at instant T22 as shown as the voltage waveform thereat in FIG. 18. At this instant, the switches S22 and S23 are turned on to clamp the voltage at the terminal TP21 to the sustained discharge pulse voltage (−VS) and the voltage at the terminal TP22 to zero voltage.

In this third prior art, as shown in FIG. 18, the "on" time of the switches S25 and S26 need not be limited to the rise or fall time of the output pulse, and may be extended without any operational problem up to the end of the subsequent clamp time (of 1 to 5 microseconds or more).

It is thus possible to realize a plasma display panel by using prior art power MOS FETs even with as shot rise or fall time of 0.2 to 0.5 microsecond.

In the third prior art, however, as is seen from the voltage waveforms at the terminals TP21 and TP22 as shown in FIG. 18, a jump voltage ΔV is always caused when the clamp circuit is turned on at the rising and falling of pulse (i.e., at instant T22 and T24) due to power loss in the energy recovery circuit, which is constituted by power MOS FETs or the like having finite "on" resistance.

Therefore, at the instants T22 and T24 a rash current is caused through the clamp circuit, resulting in power loss in the switches S21 to S24 and also noise.

As has been described, the above prior arts have the following problems.

In the first prior art, it is difficult to obtain highly efficient energy recovery operation during high rate pulse generation.

In the second and third prior arts, the operation of switches for voltage clamping causes a rash current to result in power loss and noise generation.

SUMMARY OF THE INVENTION

The present invention was made in view of solving the problems inherent in the prior art, and a first object of the invention is to provide a energy recovery type capacitive load drive, which can solve the problem in the first prior art that it is difficult to obtain highly efficient energy recovery operation during high rate pulse generation, and permits fast and efficient operation.

A second object of the present invention is to provide a energy recovery type capacitive load drive, which can provide improvements concerning the problem in the third prior art that the operation of switches for voltage clamping causes a rash current to result in power loss and noise generation, and can eliminate rash current at the time of operation of the voltage clamp switches, thus permitting pulse application to a capacitive load, such as a display panel, without power loss or noise generation due to any rash current.

According to the invention, there is provided a capacitive load drive for supplying pulses to a capacitive load comprising:

a series circuit of a coil and a capacitor with one terminal connected to a first electrode of the capacitive load;

a first voltage clamp switch connected to a first electrode of the capacitive load and also connected between one terminal of the series circuit and a high voltage side terminal of a DC power supply;

a second voltage clamp switch connected to the first electrode of the capacitive load and also connected between the one terminal of the series circuit and a low voltage side terminal of the DC power supply;

a first energy recovery switch connected between the other terminal of the series circuit and the high voltage side terminal of the DC power supply;

a second energy recovery switch connected between the other terminal of the series circuit and the low voltage side terminal of the DC power supply; and diodes connected in parallel with the respective switches such that their cathode terminals are connected the high voltage side terminal of the DC power supply. In the capacitive load drive, pulses are supplied to the reactive load while recovering ineffective energy thereof by repeating:

(a) a first step of turning on only the first voltage clamp switch (S3) connected to the high voltage side terminal of the DC power supply to clamp the voltage at the first electrode of the capacitive load to the voltage at the high voltage side terminal of the DC power supply;

(b) a second step of causing a first resonant current by turning off the first and second voltage clamp switches (S3 and S4) and turning on the second energy recovery switch (S2) connected to the low voltage side terminal of the DC power supply to cause the voltage at the first electrode of the capacitive load to rise from the voltage at the high voltage side terminal of the DC power supply to the voltage at the low voltage side terminal of the DC power supply;

(c) a third step of turning on the second voltage clamp switch (S4) connected to the low voltage side terminal of the DC power supply to clamp the voltage at the first electrode of the capacitive load to the voltage at the low voltage side terminal of the DC power supply;

(d) a fourth step of turning off the second energy recovery switch (S2) connected to the low voltage side terminal of the DC power supply during a period, during which the first resonant current in the coil (L1) is reversed in direction and a second resonant current is flowing in the reversed direction;

(e) a fifth step of turning on only the second voltage clamp switch (S4) connected to the low voltage side terminal of the DC power supply to clamp the voltage at the first electrode of the capacitive load to the voltage at the low voltage side terminal of the DC power supply;

(f) a sixth step of causing a third resonant current by turning off the first and second voltage clamp switches (S3 and S4) and by turning on the energy recovery switch S1 to cause the voltage at the first electrode of the capacitive load to rise from the voltage on the low voltage side terminal of the DC power supply to the voltage at the high voltage side terminal of the DC power supply;

(g) a seventh step of turning on the first voltage clamp switch (S3) connected to the high voltage side terminal of the DC power supply to lamp the voltage at the first electrode of the capacitive load to the voltage at the high voltage side terminal of the DC power supply; and (h) an eighth step of turning off the energy recovery switch (S1) connected to the high voltage side terminal of the DC power supply during a period, during which the third resonant current in the coil (L1) is reversed in direction and a fourth resonant current is flowing in the reversed direction.

According to another aspect of the present invention, there is provided a capacitive load drive for supplying pulses to a capacitive load comprising:

a series circuit of a first coil and a capacitor with one terminal connected to a first electrode of the capacitive load;

a first voltage clamp switch connected to a first electrode of the capacitive load and also connected between one terminal of the series circuit and a high voltage side of a DC power supply, a first diode being connected in parallel to the first voltage clamp switch, a second voltage clamp switch connected to the first electrode of the capacitive load and also connected to a low voltage side terminal of the DC power supply; a second diode being connected in parallel to the second voltage clamp switches;

a third diode connected to the other terminal of the series circuit and also connected to the high voltage side terminal of the DC power supply;

a fourth diode connected to the other terminal of the series circuit and also connected to the low voltage side terminal of the DC power supply;

a second coil one terminal of which is connected to the other terminal of the series circuit;

a first energy recovery switch connected to the other terminal of the second coil and the high voltage side terminal of the DC power supply;

a second energy recovery switch connected between the other terminal of the second coil and the low voltage side terminal of the DC power supply; and cathode terminals of the diodes are nearer the high voltage side terminal of the DC power supply. In the above capacitive load drive, pulses are supplied to the reactive load while recovering ineffective energy thereof by repeating:

(a) a first step of turning on only the first voltage clamp switch (S3) connected to the high voltage side terminal of the DC power supply to clamp the voltage at the first electrode of the capacitive load to the voltage at the high voltage side terminal of the DC power supply;

(b) a second step of causing a first resonant current by turning off all of the clamp switches and turning on the second energy recovery switch (S2) connected to the low voltage side terminal of the DC power supply to cause the voltage at the first electrode of the capacitive load to rise from the voltage at the high voltage side terminal of the DC power supply to the voltage at the low voltage side terminal of the DC power supply;

(c) a third step of turning on the second voltage clamp switch (S4) connected to the low voltage side terminal of the DC power supply to clamp the voltage at the first electrode of the capacitive load to the voltage at the low voltage side terminal of the DC power supply;

(d) a fourth step of turning off the second energy recovery switch (S2) connected to the low voltage side terminal of the DC power supply during a period, during which the first resonant current in the coil (L3) is reversed in direction and a second resonant current is flowing in the reversed direction;

(e) a fifth step of turning on only the second voltage clamp switch (S4) connected to the low voltage side terminal of the DC power supply to clamp the voltage at the first electrode of the capacitive load to the voltage at the low voltage side terminal of the DC power supply;

(f) a sixth step of causing a third resonant current by turning off all of the voltage clamp switches and by turning on the first energy recovery switch S1 (S3 and S4) to cause the voltage at the first electrode of the capacitive load to rise from the voltage on the low voltage side terminal of the DC power supply to the voltage at the high voltage side terminal of the DC power supply;

(g) a seventh step of turning on the first voltage clamp switch (S3) connected to the high voltage side terminal of the DC power supply to clamp the voltage at the first electrode of the capacitive load to the voltage at the high voltage side terminal of the DC power supply; and (h) an eighth step of turning off the energy recovery switch (S1) connected to the high voltage side terminal of the DC power supply during a period, during which the third resonant current in the coil (L3) is reversed in direction and a fourth resonant current is flowing in the reversed direction.

According to other aspect of the present invention, there is provided a capacitive load drive for supplying pulses to a capacitive load comprising:

a first parallel circuit including a first diode having a cathode connected to a high voltage side terminal of a DC power supply connected in parallel to a first switch;

a second parallel circuit including a second diode having an anode connected to a lower voltage terminal of the DC power supply connected in parallel to a second switch;

a first series circuit comprising series connection circuit of the first and second parallel circuits;

a third parallel circuit including a third diode having a cathode connected to a high voltage side terminal of a DC power supply connected in parallel to a third switch;

a fourth parallel circuit including a fourth diode having an anode connected to a lower voltage terminal of the DC power supply connected in parallel to a fourth switch;

a second series circuit comprising series connection circuit of the third and fourth parallel circuits;

a third series circuit of a coil and a capacitor connected between the connection points of the first and second series circuits;

wherein the capacitive load is connected between the series connection point of the first series circuit and the cathode of the first diode, the high voltage side terminal of the DC power supply is connected to the cathodes of the first and third diodes, and the lower voltage terminal of the DC power supply is connected to the anodes of the second and fourth diodes.

According to still other aspect of the present invention, there is provided a capacitive load drive for supplying pulses to a capacitive load comprising:

a first parallel circuit including a first diode having a cathode connected to a high voltage side terminal of a DC power supply connected in parallel to a first switch;

a second parallel circuit including a second diode having an anode connected to a lower voltage terminal of the DC power supply connected in parallel to a second switch;

a first series circuit comprising series connection circuit of the first and second parallel circuits;

a second series circuit of a third diode having a cathode connected to a high voltage side terminal of the DC power supply and a fourth diode having an anode connected to a lower voltage terminal of the DC power supply;

a third series circuit of a third switch and a fourth switch connected between the lower and higher voltage terminals;

a fourth series circuit of a coil and a capacitor connected between the series connection points of the first and second series circuits;

a coil connected between the series connection points of the second and third series circuits; wherein the capacitive load is connected between the series connection point of the first series circuit and the cathode of the first diode, the high voltage side terminal of the DC power supply is connected to the cathodes of the first and third diodes and the third switch, and the lower voltage terminal of the DC power supply is connected to the anodes of the second and fourth diodes and the fourth switch.

With the above constitution of the present invention, it is possible to solve all the above problems inherent in the prior art. Specifically, the above circuit construction according to the present invention permits fast operation of a energy recovery type capacitive load drive, the energy recovery efficiency of which has heretofore been high when it is fast operated, thus permitting application of such a drive for driving a plasma display panel as well.

According to the present invention, it is also possible to realize a energy recovery type capacitive load drive, which is free from any rash current in voltage clamping operation and is thus free from power loss or noise generation due to any rash current.

Other objects and features will be clarified from the following description with reference to attached drawings.

PREFERRED EMBODIMENTS OF THE INVENTION

Figure 7A:
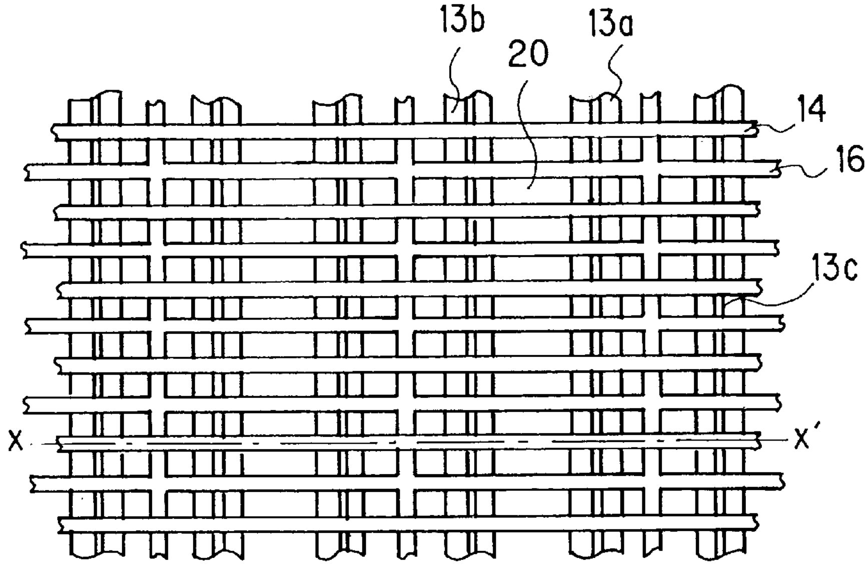
FIG. 7A PRIOR ART
FIGS. 7A and 7 B are a plan view and a sectional view taken along line x-x' in FIG. 7A of AC memory type plasma display panel structure.
Figure 7B:
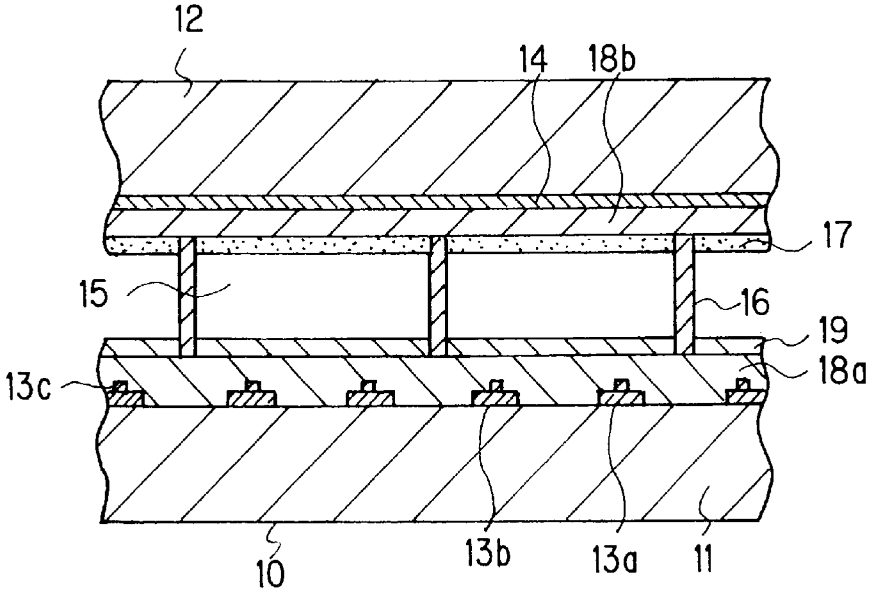
FIG. 7B PRIOR ART
Figure 8:
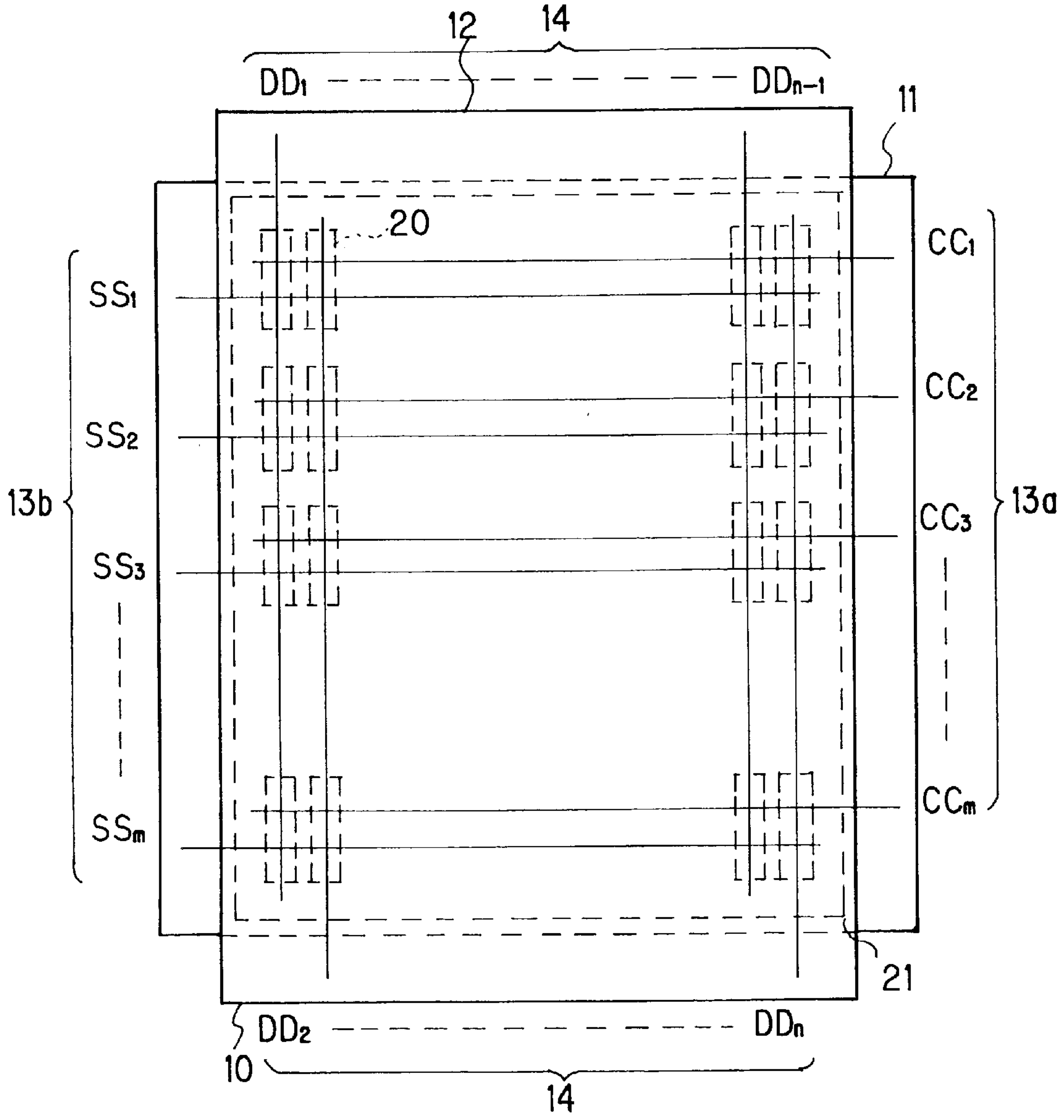
FIG. 8 PRIOR ART
FIG. 8 is a plan view showing only the electrodes of the plasma display panel shown in FIGS. 7A and 7 B.
Figure 9:
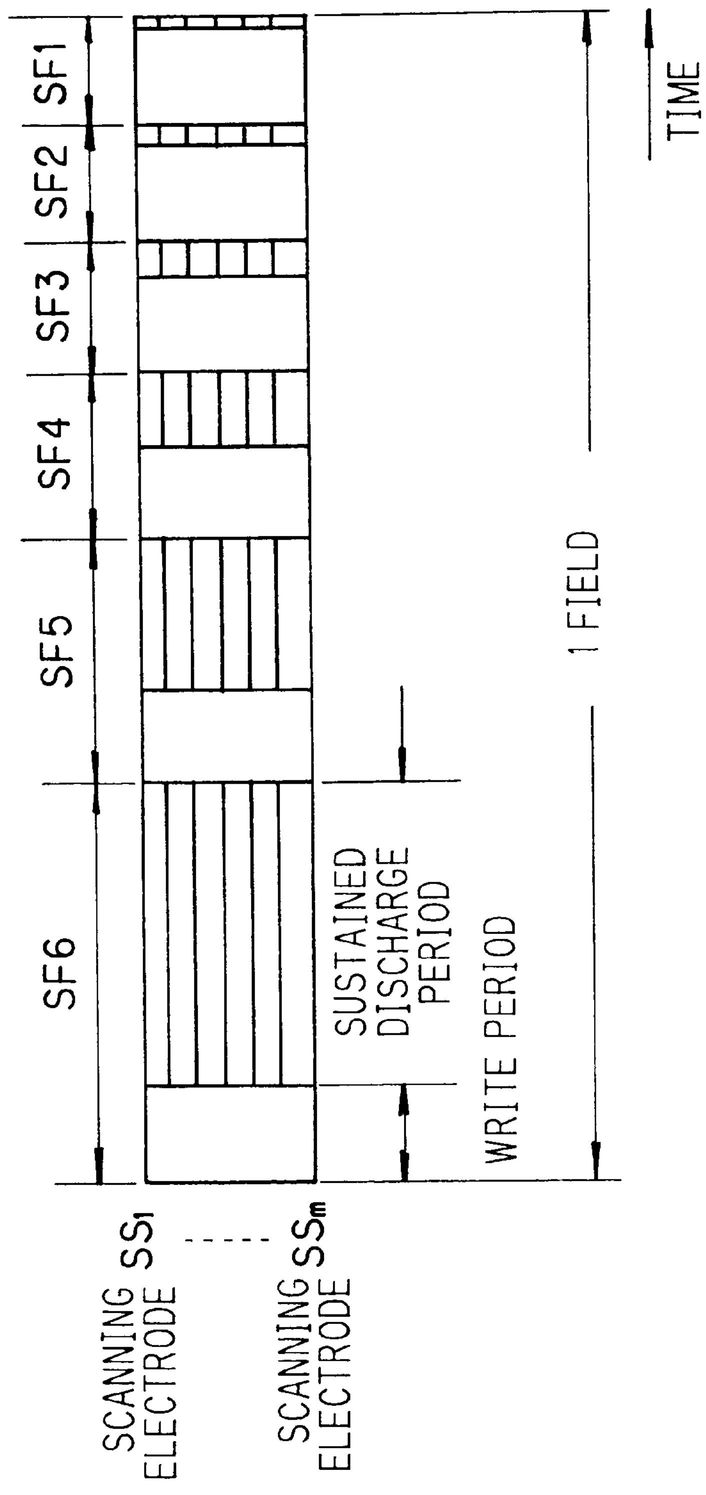
FIG. 9 PRIOR ART
FIG. 9 is a view for describing a drive sequence in the sub-field method.
Figure 10:
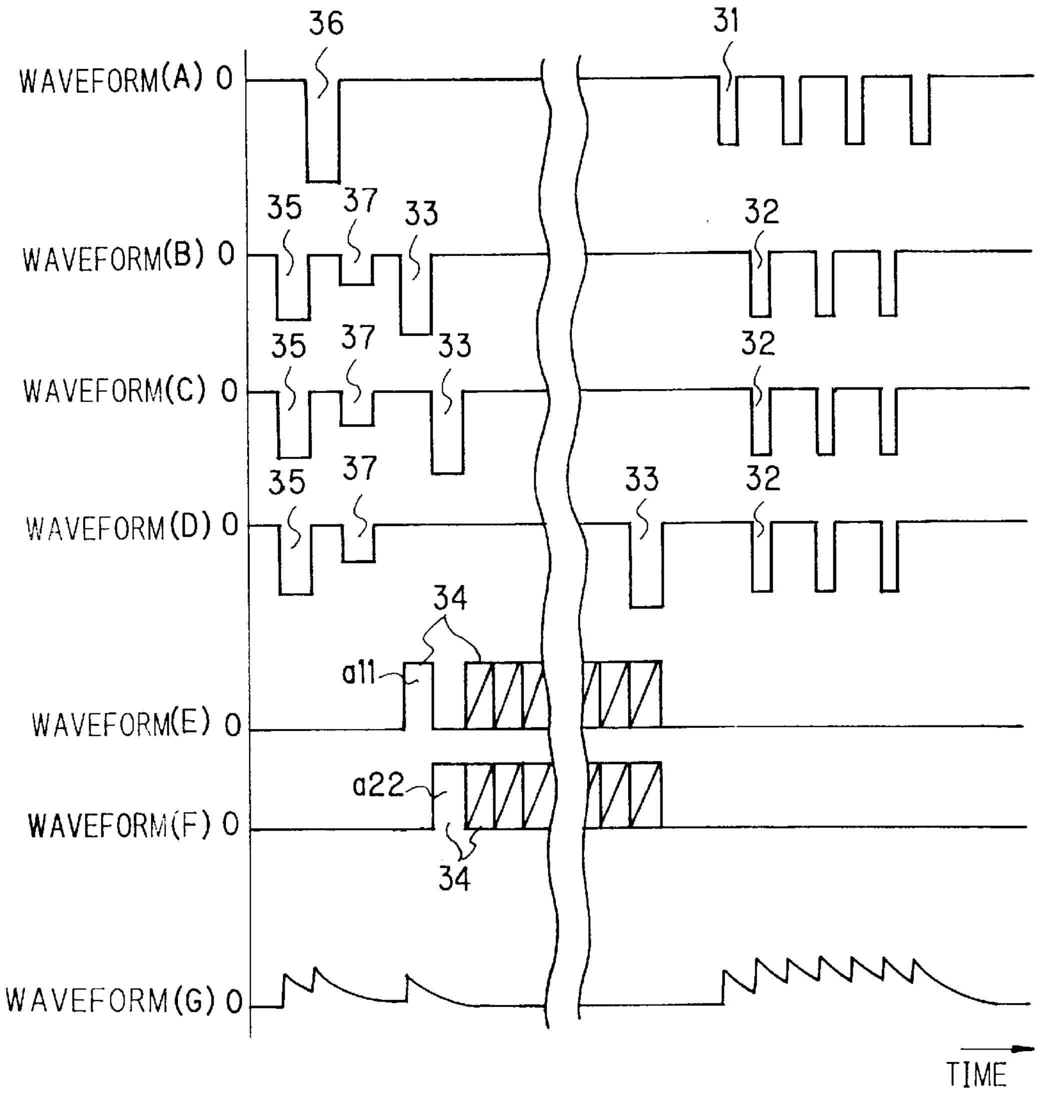
FIG. 10 PRIOR ART
FIG. 10 is a view showing an example of drive voltage waveforms and light emission waveforms in a sub-field in the prior art plasma display panel shown in FIGS. 7 and 8.

An embodiment of the invention will now be described in connection with its application to the plasma display panel shown in FIGS. 7 and 8, which has been described as a capacitive load in connection with the prior art. The plasma display panel comprises 480 scanning electrodes SS1, SS2, . . . , SSm, 480 sustained discharge electrodes CC1, CC2, CCm and 1,920 column electrodes DD1, DD2, . . . , Dn. In the panel, the inter-pixel pitch is 0.35 mm between adjacent column electrodes and 1.05 mm between adjacent scanning electrodes, and the distance between the plane of the scanning electrodes and the plane of the column electrodes is 0.1 mm.

Figure 11:
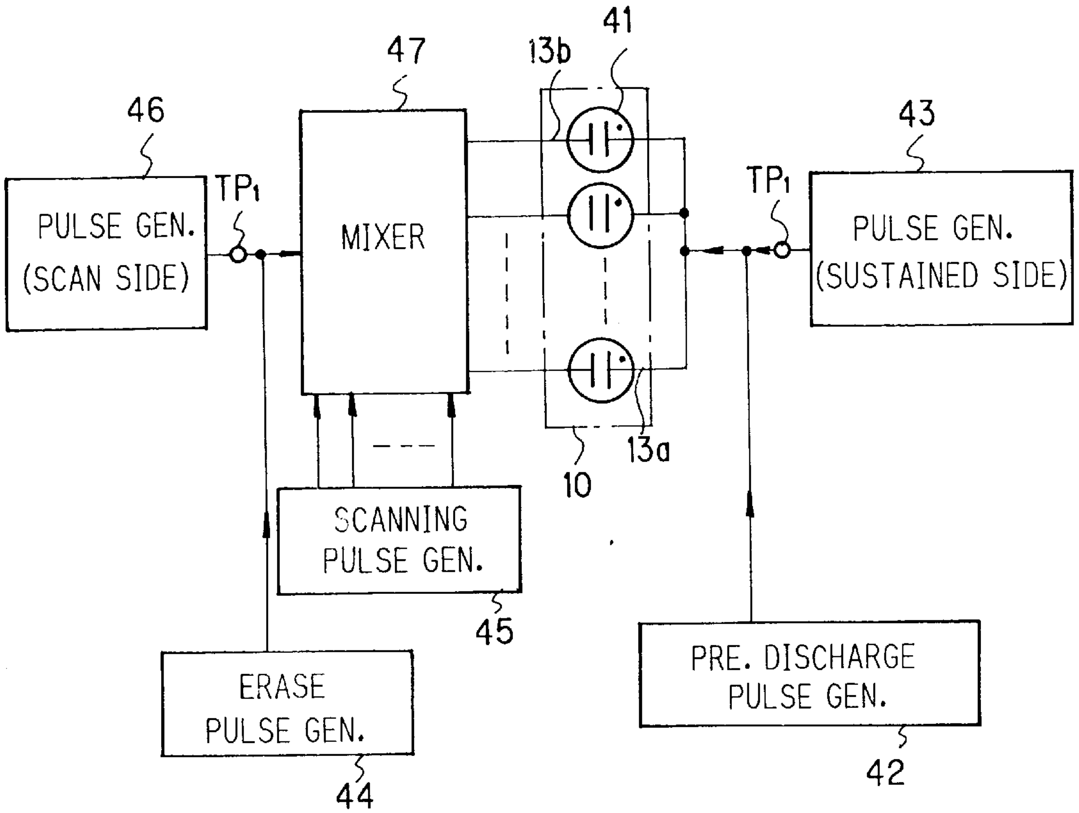
FIG. 11 PRIOR ART
FIG. 11 is a block diagram of a prior art AC memory type plasma display panel drive.

The circuit construction involved is the same as shown in FIG. 11, and the capacitive load drive according to the present invention is applied to the sustained discharge and scanning electrode side sustained discharge pulse generators 43 and 46.

Figure 1:
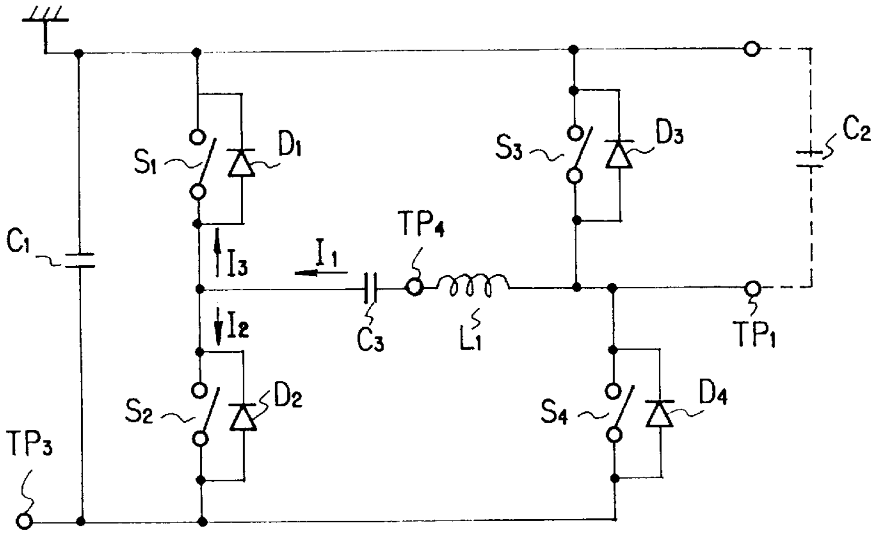
FIG. 1 is a circuit diagram showing the circuit construction of a first embodiment of the capacitive load drive according to the present invention.

FIG. 1 is a circuit diagram showing the circuit construction of a first embodiment of the capacitive load drive according to the present invention. Referring to FIG. 1, the illustrated circuit comprises a DC power supply output capacitor C1, resultant capacitance C2 of the external capacitance including the floating capacitance in the circuit and the equivalent electrostatic capacitance between the scanning and the sustained discharge electrode and between these electrodes and the column electrodes in the plasma display panel, high voltage side switches S1 to S4, diodes D1 to D4 and a energy recovery coil L1. Designated at TP1 is an output terminal of the sustained discharge or scanning electrode side sustained discharge pulse generator 43 or 46 shown in FIG. 11, at TP3 a terminal connected to a DC power supply providing the sustained discharge pulse voltage (−VS), and at TP4 a terminal connected to the coil L1 and a capacitor C3 in series therewith.

Figure 12:
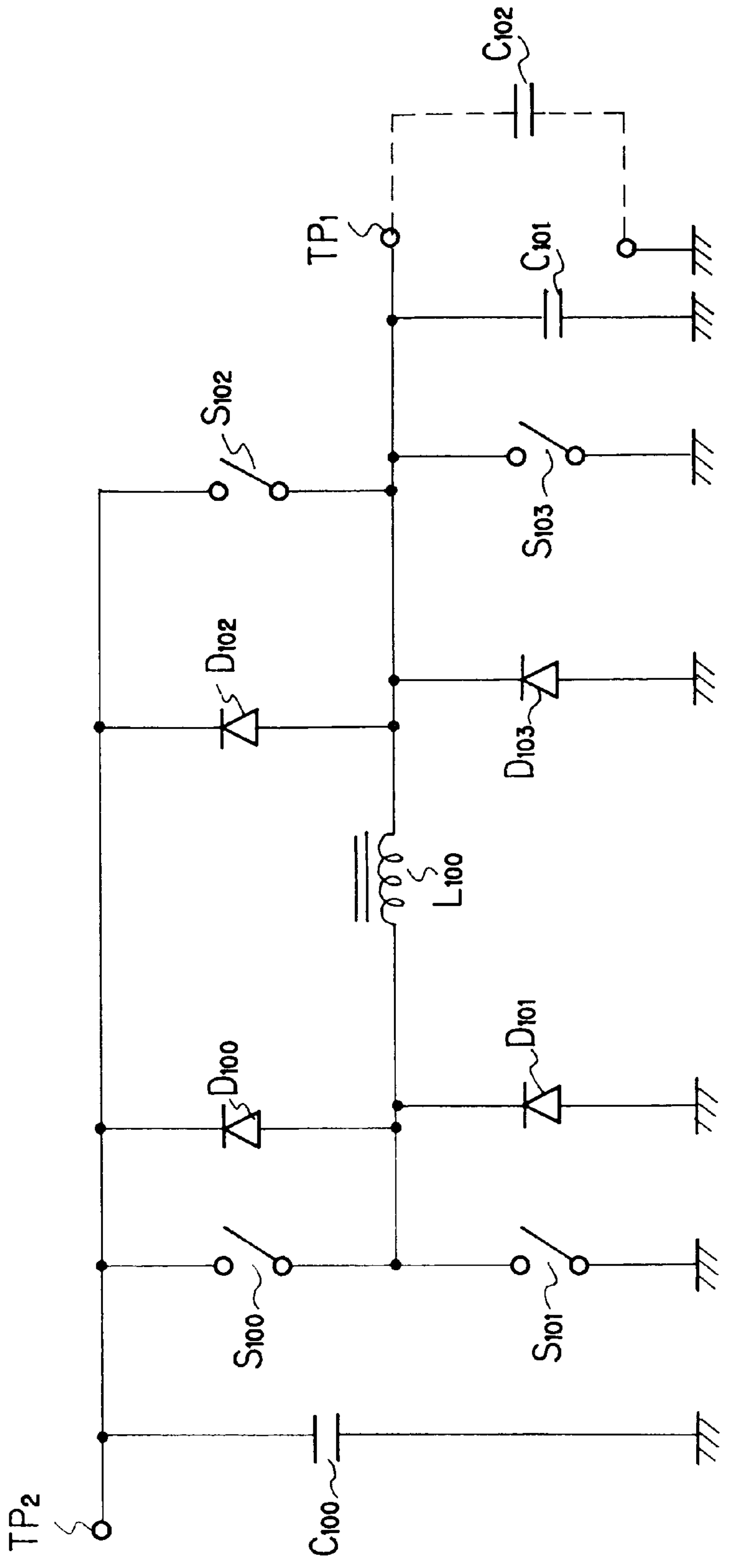
FIG. 12 PRIOR ART
FIG. 12 is a circuit diagram showing the basic construction of the prior art sustained discharge pulse generating circuit with a power recovering circuit, for generating sustained discharge pulses.
Figure 13:
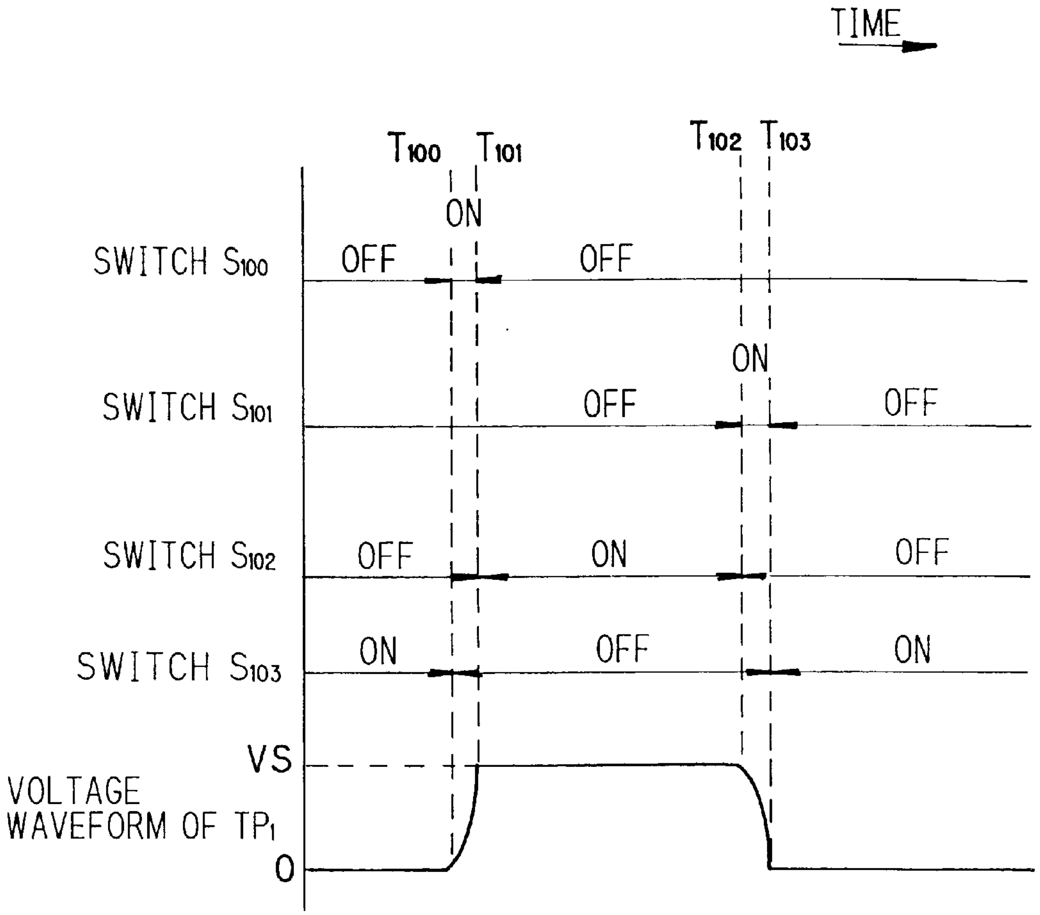
FIG. 13 PRIOR ART
FIG. 13 shows timing chart for explaining the operation of FIG. 12.
Figure 14:
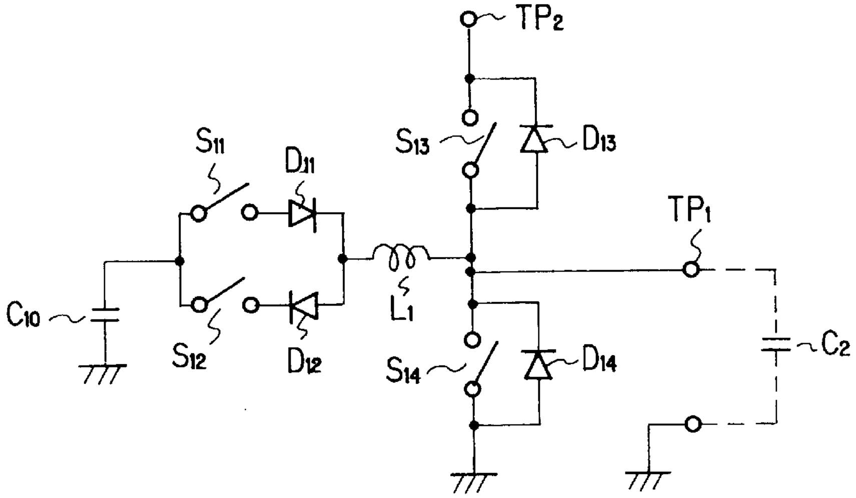
FIG. 14 PRIOR ART
FIG. 14 is a circuit diagram showing the basic circuit of the second prior art.
Figure 17:
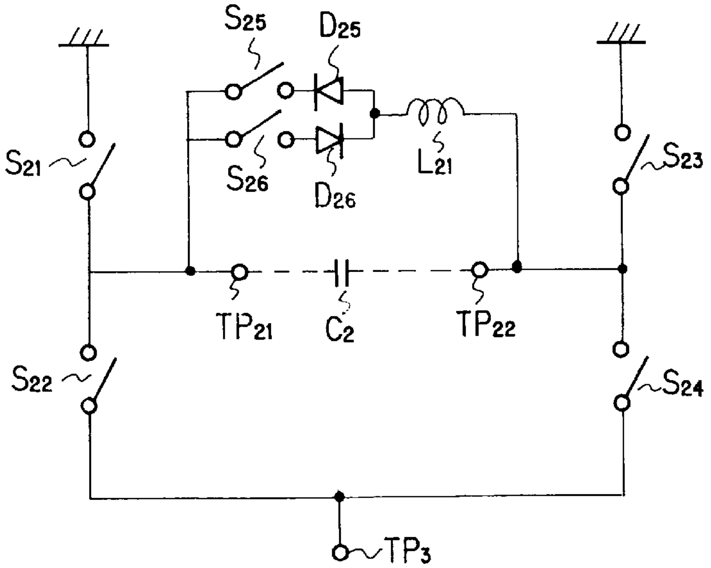
FIG. 17 PRIOR ART
FIG. 17 is a circuit diagram showing the sustained discharge pulse generator 48 of the third prior art.
Figure 15:
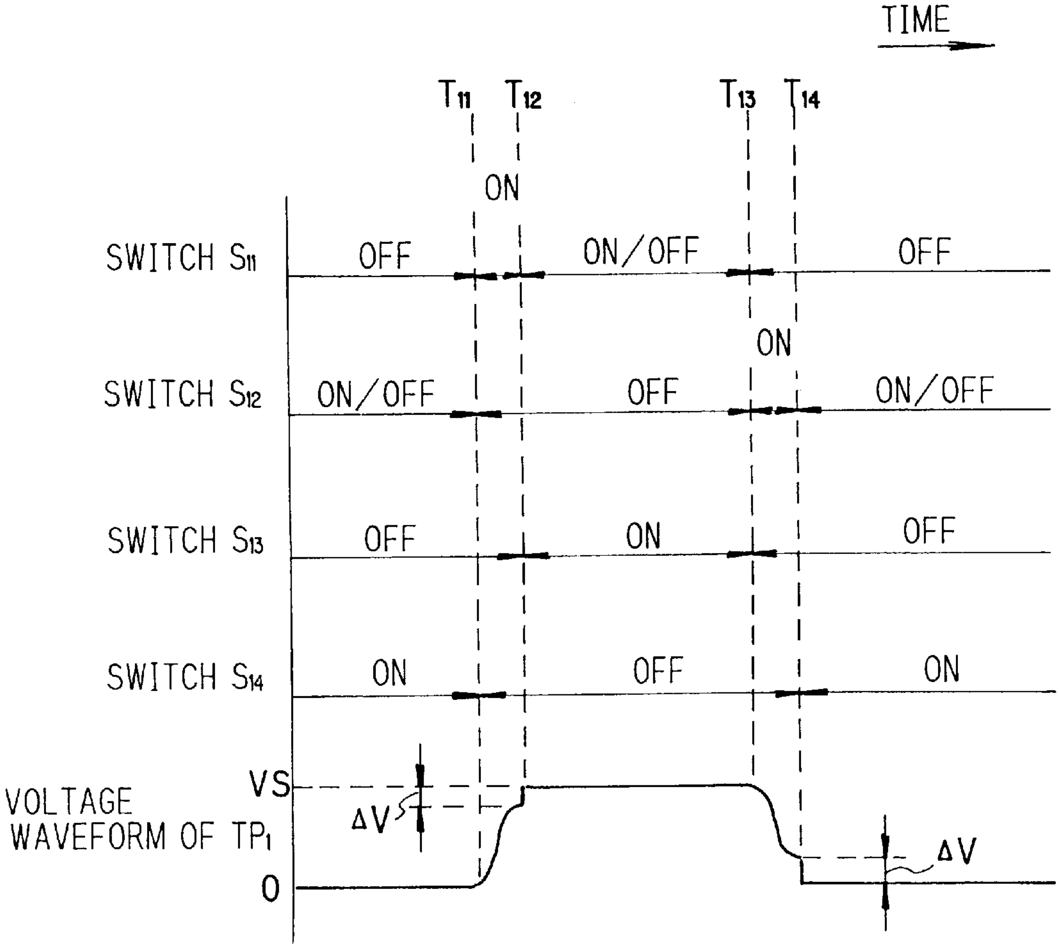
FIG. 15 PRIOR ART
FIG. 15 shows the operation of switches and output voltage waveform in the circuit shown in FIG. 14.
Figure 16:
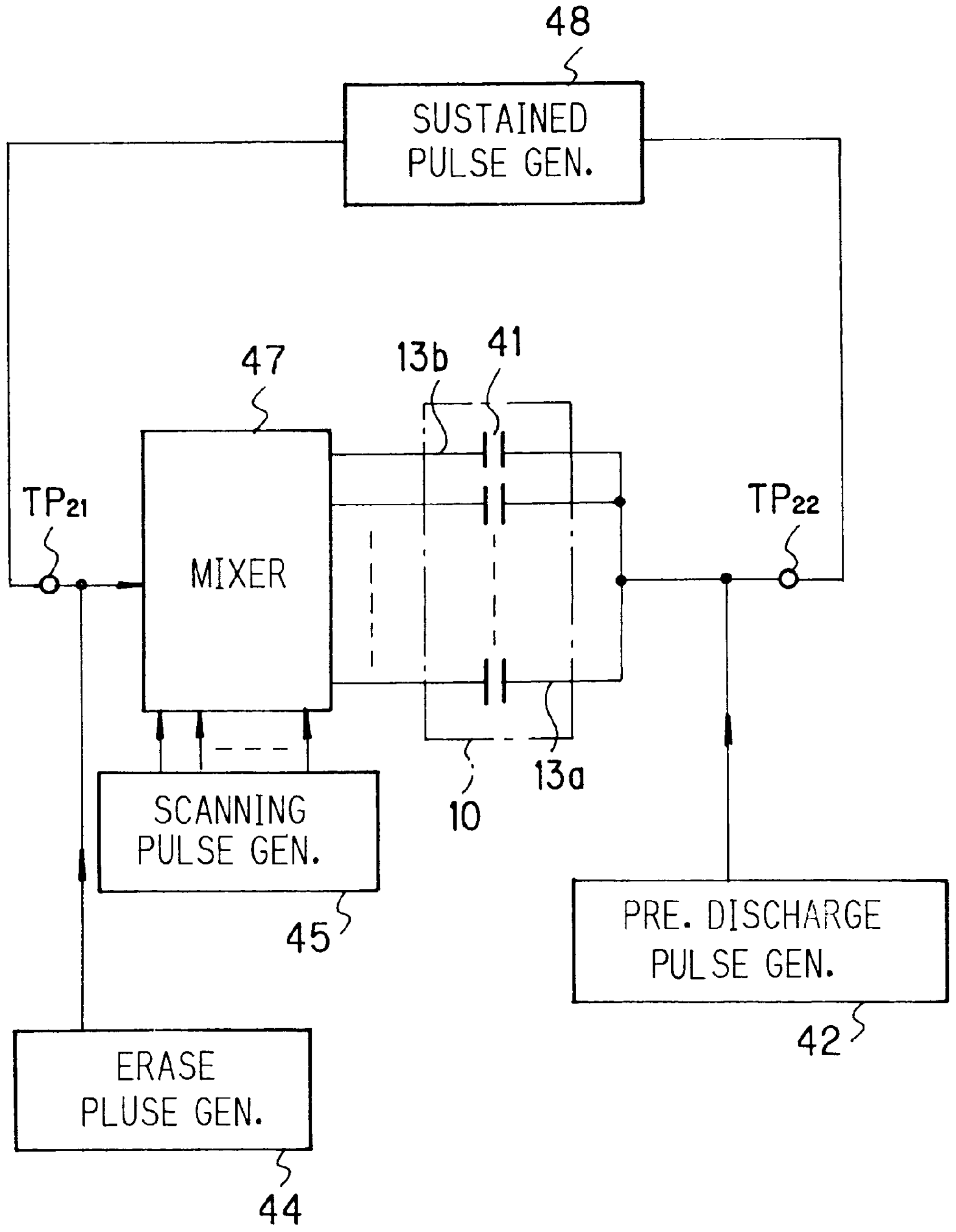
FIG. 16 PRIOR ART
FIG. 16 is a block diagram showing the basic construction of the third prior art.
Figure 18:
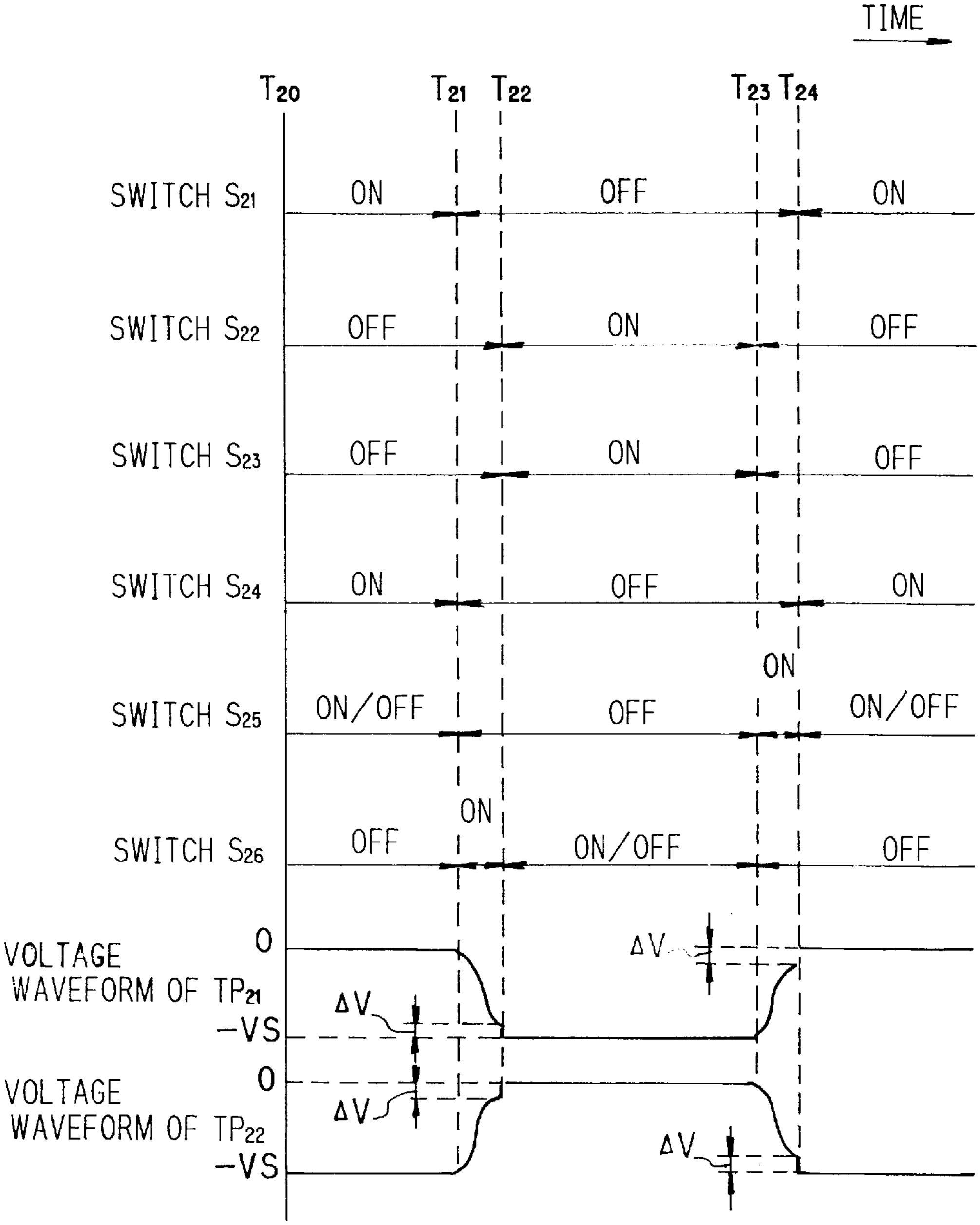
FIG. 18 PRIOR ART
FIG. 18 shows a timing chart for explaining the operation of FIG. 17.

The embodiment shown in FIG. 1 is the same as the prior art circuit shown in FIG. 12 only except for that the capacitor C3 is additionally provided for energy recovery.

Although the embodiment is different form the prior art circuit shown in FIG. 12 only in that the energy recovery capacitor C3 is additionally provided so far as the circuit construction is concerned, it is quite different from the prior art circuit in the circuit operation. The basic operation of the circuit of this embodiment of the capacitive load drive will now be described in detail. It is assumed that negative polarity sustained discharge pulses are generated.

Figure 2:
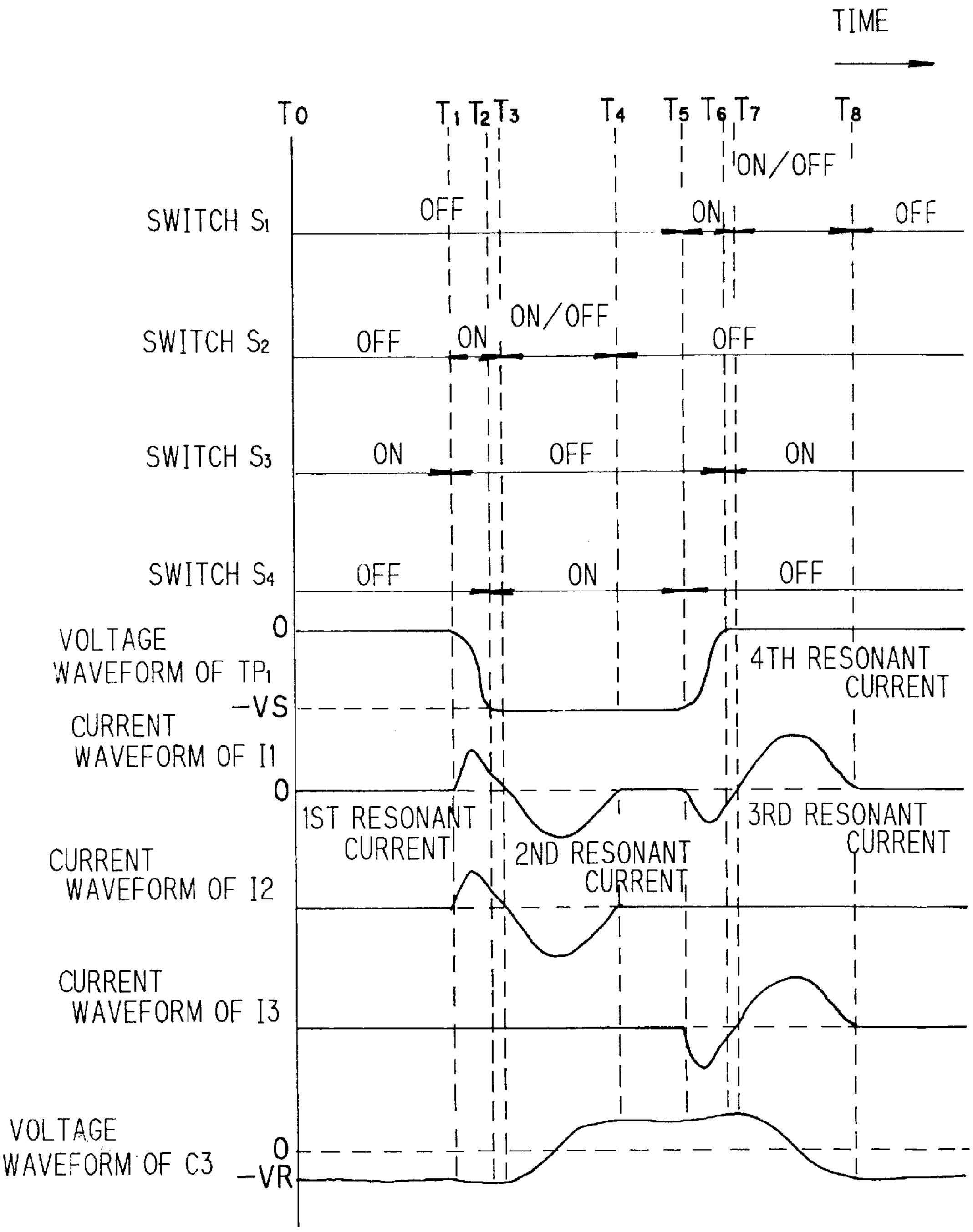
FIG. 2 is a waveform chart illustrating operations of the drive shown in FIG. 1.

FIG. 2 is a waveform chart illustrating operations of the energy recovery switches S1 and S2 and the voltage clamp switches S3 and S4 in the circuit and showing the voltage waveform at the terminal TP1, waveforms of currents I1 to I3 (the current polarity being positive in the direction of arrows in FIG. 1), and voltage waveform of the terminal voltage across the capacitor C3 (with reference to the terminal TP4). Labeled T0 to T8 are instants of time.

At the instant T0 no sustained discharge pulse prevails. At the time, the voltage at the terminal TP1 is zero, and only the voltage clamp switch S3 is "on". In a steady state of pulse generation, the voltage (−VR, VR>0) across the electrostatic capacitor C3 is less than and approximately one half of the sustained discharge pulse voltage (=VS,VS>0).

That is, assuming $$\Delta VR=|VS|/2-|VR|,$$

$$\Delta VR>0.$$

When the voltage clamp switch S3 is turned off while turning on the energy recovery switch S2 at the instant T1, a first resonant current is caused through the coil L1, the capacitor C3 and the energy recovery switch S2 to charge the electrostatic capacitance C2 of the panel, as shown in the waveform of current I1 in FIG. 2. Since the terminal voltage across the capacitance C3 is less than |VS|/2, at the instant T1 the terminal voltage across the coil L1 is greater than |VS|/2. Thus, at the instant T2 of substantial converging of the first resonant current, the voltage at the terminal TP1 becomes lower than −VS.

When the voltage at the terminal TP1 becomes lower than the voltage (−VS) at the terminal TP3 providing the power supply voltage at the instant T2, the diode D4 is turned on.

As a result, the voltage at the terminal TP1 is clamped to the sustained discharge pulse voltage (−VS). At the same time, the voltage clamp switch S4 is turned on. When this state is brought about, a second resonant current turns to flow through the closed circuit of the coil L1, the capacitor C3, the energy recovery switch S2 or the diode D2, and the voltage clamp switch S4.

Denoting the resonance period by T, the inductance of the coil by Land the electrostatic capacitance by C, $$T=2\pi(LC)^{1/2}$$

Since (capacitance of C3)>>(capacitance of C2), the second resonant current flows slowly compared to the panel charging current.

The second resonant current is reversed at the instant T3. The energy recovery switch S2 should be held "on" up to the instant T3 but may be turned off during a time period from the instant T3 till the instant T4. By so doing, the second resonant current continues to flow up to the instant T4 and is then converged.

During the period from the instant T3 till the instant T4 current I2 has to flow at least the diode D2. The energy recovery switch S2 thus can reduce current to zero when its terminal voltage corresponds to the voltage drop across the diode. The switch S2 thus can be turned off with very little power loss.

Subsequently, the voltage at the terminal TP1 is reduced to zero. At the instant T5 the clamping switch S4 is turned off while the energy recovery switch S1 is turned on. As a result, the electrostatic capacitance C2 of he panel is discharged, causing a third resonant current through the coil L1, the capacitor C3 and the energy recovery switch S1. Since the voltage across the capacitance is less than |VS|/2, at the instant T5 the terminal voltage across the coil L1 is greater than |VS|/2. Thus, at the instant T6 of substantial converging of the third resonant current, the voltage at the terminal TP1 becomes higher than zero voltage.

When the voltage at the terminal TP1 becomes higher than zero voltage at the instant T6, the diode D3 is turned on. As a result, the voltage at the terminal TP1 is clamped to zero voltage. At the same time, the clamping switch S3 is turned on.

When this state is brought about, a fourth resonant current turns to flow through the closed circuit of the coil L1, the capacitor C3, the energy recovery switch S1 or the diode D1, and the clamping switch S3.

The fourth resonant current is reversed at the instant T7. The energy recovery switch S1 should be held "on" until the instant T7, and is turned off during a period from the instant T7 till the instant T8. In consequence, the fourth resonant current continues to flow until the instant T8, and is then converged. During a period from the instant T7 till the instant T8, the fourth resonant current should flow through at least the diode D1. The energy recovery switch S1 thus can reduce the current to zero when its terminal voltage corresponds to the voltage drop across the diode, and can be turned off with very little power loss.

The electrostatic capacitance of the energy recovery capacitor C3 is selected to be at least double, preferably at least tree times, the electrostatic capacitance C2 of the panel. If the electrostatic capacitance of the capacitor C3 is less than the electrostatic capacitance C2 of the panel, sufficient voltage is not applied to the panel side at the time of the resonance; for instance the voltage at the terminal TP1 fails to fall down to −VS.

The electrostatic capacitance of the energy recovery capacitor C3 is selected to be less than 30 times, preferably less than 15 times, the electrostatic capacitance C2 of the panel. If the electrostatic capacitance of the capacitor C3 is extremely great compared to the electrostatic capacitance C2 of the panel, the second or fourth resonant current peak is increased to increase power loss. Some peak current ratios are shown in Table 1.

TABLE 1

| Capacitor 3 | Charge ratio of C3 | $2^{nd}$ or $4^{th}$ resonance current continue time ratio | $2^{nd}$ or $4^{th}$ resonance current peak ratio |
|---|---|---|---|
| 2 · C2 | 1 | 1 | 1 |
| 4 · C2 | 2 | 1.4 | 1.4 |
| 9 · C2 | 4.5 | 2.1 | 2.1 |

The power energy that is stored in the capacitor C3 in every energy recovery pulse fall or rise cycle is proportional to:

(pulse energy stored in the series resultant capacitance of the electrostatic capacitance of the capacitor C3 and the electrostatic capacitance C2 of the panel)×(electrostatic capacitance C2 of the panel)/(electrostatic capacitance of the capacitor C3).

This means that the power energy stored in the capacitor C3 in every pulse fall or rise cycle is reduced by increasing the capacitance of the capacitor C3.

Without any generated pulse, the terminal voltage VR across the capacitor C3 is determined by the state of equilibrium between the power energy stored in the capacitor C3 and the power loss due to the resistance in the Power recovery circuit in this embodiment in every energy recovery pulse fall or rise time.

Unless the terminal voltage VR across the capacitor C2 is held within VS/2, the voltage at the terminal TP1 fails to fall down to the sustained discharge pulse voltage (−VS) at the end of the pulse fall, thus resulting in a rash current through the clamping switch S4.

Also, unless the voltage VR is held within VS/2, the voltage at the terminal TP1 fails to fall down at the ground voltage at the end of the pulse rise, thus resulting in a rash current through the clamping switch S3.

The pulse fall and rise times will now be obtained by using specific values, for instance by assuming the electrostatic capacitance C2 of the panel to be 10 nF, the electrostatic capacitance of the capacitor C3 to be 100 nF and the inductance of the coil L1 to be 1 microhenry. The series resultant capacitance of the electrostatic capacitance C2 and the capacitance of the capacitor C3 is thus 9.09 nF.

In this case, the pulse fall time TR1 (i.e., time interval from the instant T1 till the instant T2), which is one half the first resonance cycle, is $$TR1=\pi\{(L1\times(\text{series resultant capacitance of } C2) \text{ and } C3)\}^{1/2}=0.30 \text{ microsecond.}$$

The time from the instant T2 till the instant T3 is less than the time TR1 in the order of one digit place, and hence substantially ignorable.

The time internal TR2 from the instant T3 till the instant T4, which is one half the second resonance cycle, is thus $$TR2=\pi(L1=C3)^{1/2}.$$

Similar calculations apply to the pulse rise time.

The peak currents in this case will now be considered. As for the first resonance peak current, assuming the sustained discharge pulse voltage VS to be VS=200 V, the charge Q1 which the electrostatic capacitance C2 is charged by is $$Q1=C2\times VS=2 \text{ microcoulombs.}$$

In this charging, a substantially sinusoidal current flows for a period of 0.3 microsecond. The peak current is thus 9.4 amperes.

As for the second resonance peak current, assuming the sustained discharge pulse voltage VS to be VS=200 V, the charge Q2 which the capacitor Q3 is charged by is $$Q2\approx C3\times(VS/2)=10 \text{ microcoulombs.}$$

In this charging, a substantially sinusoidal current flows for a period of 1 microsecond. The peak current is thus 14.1 amperes.

In the resonance states, current by-passes through the diodes D1 and D2 parallel with the energy recovery switches S1 and S2, and thus these switches are turned off without substantial power loss.

In addition, in the steady state of pulse generation the voltage at the terminal TP1 is caused to fall completely down to the sustained discharge pulse voltage (−VS) by the energy recovery circuit at the end of the pulse falling. Thus, no rash current is caused through the clamping switch S4.

In the steady state of pulse generation, the voltage at the terminal TP1 is also caused to rise completely to zero voltage at the end of the pulse rising, thus causing no rash current through the clamping switch S3. It is thus possible to extremely reduce power loss in the clamping switches S3 and S4 due to rash current and completely eliminate noise generation.

Figure 3:
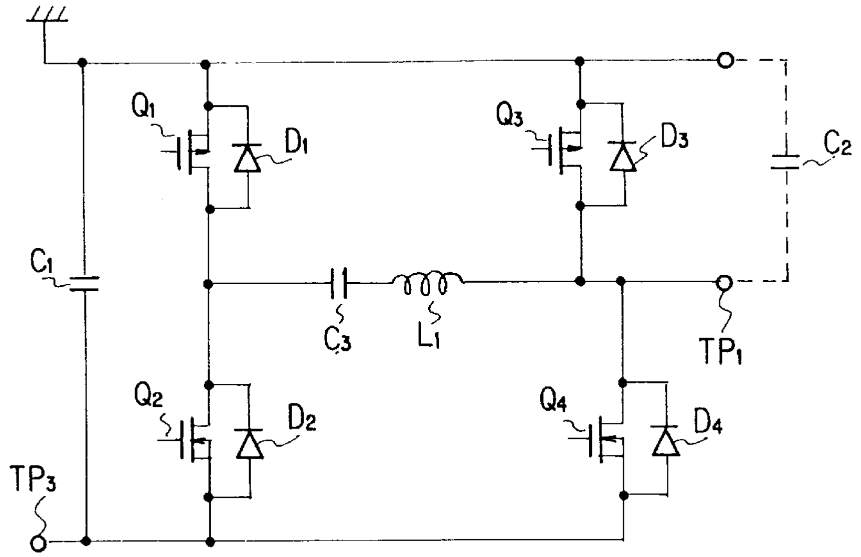
FIG. 3 is a circuit diagram showing a more specific circuit construction of the first embodiment.

FIG. 3 is a circuit diagram showing a more specific circuit construction of the first embodiment. Referring to FIG. 3 the switches S1 and S3 in the basic circuit shown in FIG. 1 are realized as p-channel FETs Q1 and Q3, and the switches S2 and S3 are realized as n-channel FETs Q2 and Q4.

The p-channel FETs Q1 and Q3 are used because the ground voltage which is free from variations can be a reference voltage for gate driving the FETs Q1 and Q2. The n-channel FETs Q2 and Q4 are used because the sustained discharge pulse source voltage free from variations, which is the voltage at the terminal TP3, can be used as a reference voltage for gate driving the FETs Q2 and Q4.

In the case of gate driving the FETs with an insulating pulse transformer or the like, n-channel FETs may be used for all the switches S1 to S4.

Furthermore, the FETs are by no means limitative, and it is possible to use bipolar transistors as well.

Figure 4:
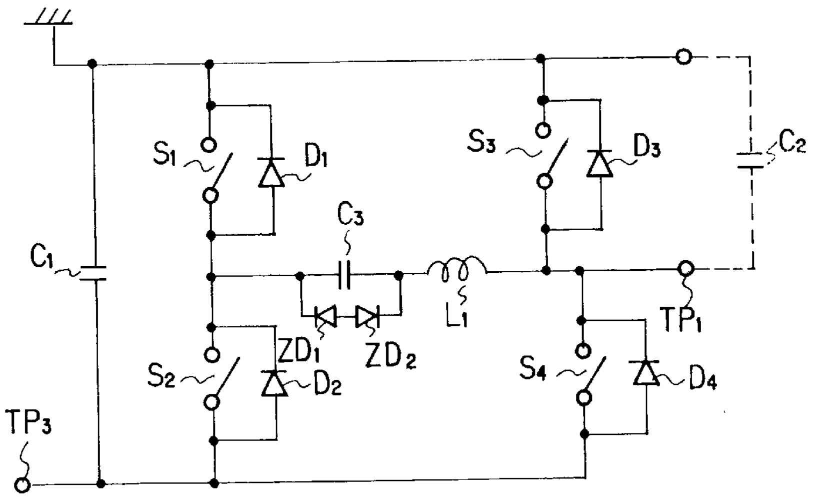
FIG. 4 is a circuit diagram showing the basic circuit construction of a second embodiment of the present invention.

FIG. 4 is a circuit diagram showing the basic circuit construction of a second embodiment of the present invention. This embodiment comprises Zener diodes ZD1 and ZD2 which are added to the first embodiment.

These Zener diodes ZD1 and ZD2 are provided to prevent the voltage across the electrostatic capacitance C2 Of the panel from sufficiently falling down to the sustained discharge pulse voltage (−VS) in the pulse falling, or from sufficiently rising up to the ground voltage in the pulse rising, due to increase of the terminal voltage across the capacitor C2 beyond VS/2.

The Zener operation voltage across the Zener diodes ZD1 and ZD2 is set to be VS/2 or less, desirably in a range of 7/10 to 9/10 of VS/2.

Figure 5:
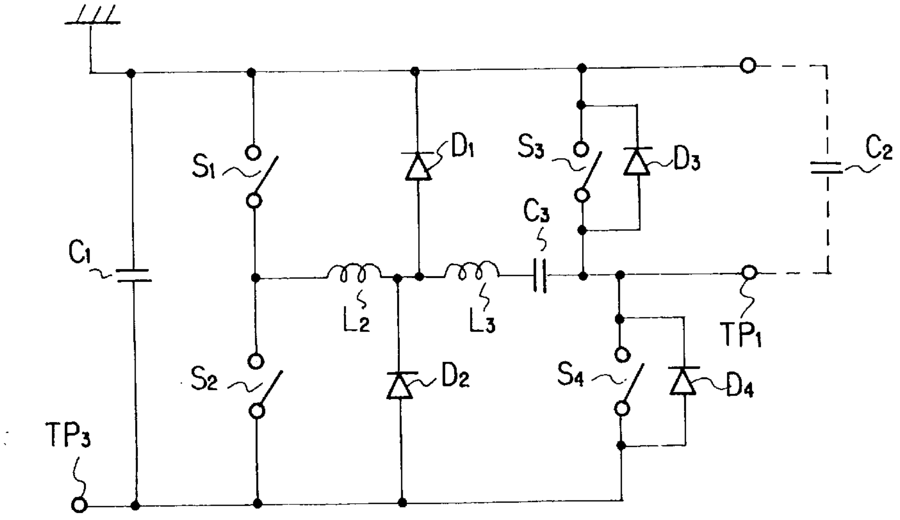
FIG. 5 is a circuit diagram showing the basic circuit construction of a third embodiment of the present invention.

FIG. 5 is a circuit diagram showing the basic circuit construction of a third embodiment of the present invention. This embodiment comprises coils L2 and L3 which are provided in lieu of the coil L1 in the first embodiment. With this construction, it is possible to reduce the times, during which the second and fourth resonant currents in the case of FIG. 2 flow.

Figure 6:
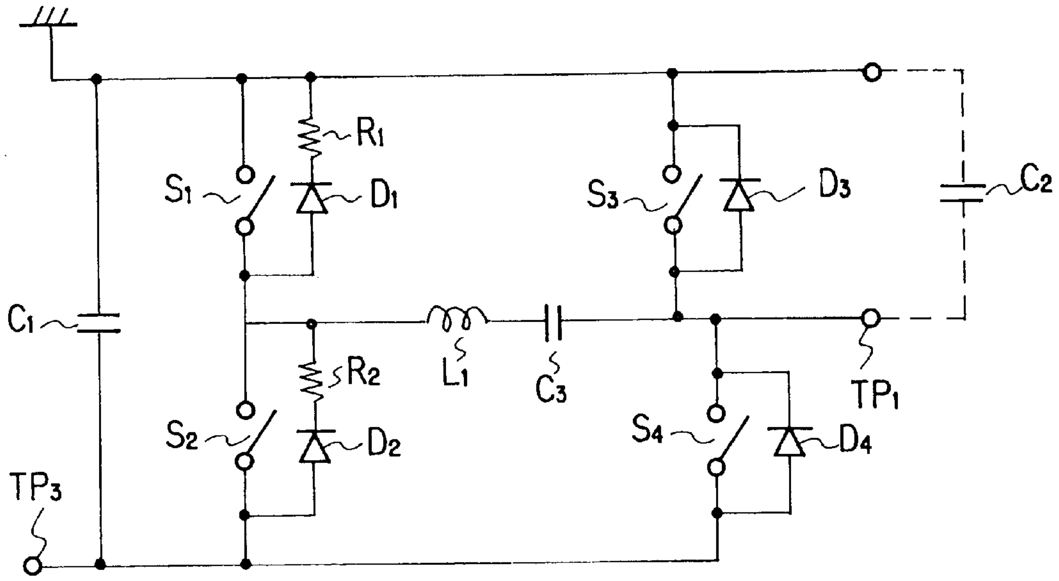
FIG. 6 is a circuit diagram showing the basic circuit construction of a fourth embodiment of the present invention.

FIG. 6 is a circuit diagram showing the basic circuit construction of a fourth embodiment of the present invention. This embodiment comprises resistors R1 and R2 provided in series with the diodes D1 and D2 in the first embodiment, respectively. With this construction, the circuit losses in the periods of flow of the second and fourth resonant currents can be stabilized. This is particularly advantageous in that the terminal voltage VR across the capacitor C3 can be stabilized during periods free from pulse generation (i.e., periods from the instant T0 to the instant T1 and after the instant T8).

As has been described in the foregoing, the energy recovery type drive according to the invention permits realization of a energy recovery type drive for applying pulses to a capacitive load such as a display panel, which can fast and efficiently operate and free from rash current, and hence power loss or noise generation due to rash current.

The energy recovery type drive circuit according to the present invention thus can improve power efficiency, suppress noise and improve reliability, so that it is very useful in industries.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A capacitive load drive for supplying pulses to a capacitive load comprising:

a series circuit of a coil and a capacitor with one terminal connected to a first electrode of the capacitive load;

a first voltage clamp switch connected to the first electrode of the capacitive load and also connected between one terminal of the series circuit and a high voltage side terminal of a DC power supply;

a second voltage clamp switch connected to the first electrode of the capacitive load and also connected between the one terminal of the series circuit and a low voltage side terminal of the DC power supply;

a first energy recovery switch connected between the other terminal of the series circuit and the high voltage side terminal of the DC power supply;

a second energy recovery switch connected between the other terminal of the series circuit and the low voltage side terminal of the DC power supply; and diodes connected in parallel with the respective switches such that their cathode terminals are connected the high voltage side terminal of the DC power supply.

2. The capacitive load drive for supplying pulses to a capacitive load according to claim 1, wherein pulses are supplied to the reactive load while recovering ineffective energy thereof by repeating:

(a) a first step of turning on only the first voltage clamp switch (S3) connected to the high voltage side terminal of the DC power supply to clamp the voltage at the first electrode of the capacitive load to the voltage at the high voltage side terminal of the DC power supply;

(b) a second step of causing a first resonant current by turning off the first and second voltage clamp switches (S3 and S4) and turning on the second energy recovery switch (S2) connected to the low voltage side terminal of the DC power supply to cause the voltage at the first electrode of the capacitive load to rise from the voltage at the high voltage side terminal of the DC power supply to the voltage at the low voltage side terminal of the DC power supply;

(c) a third step of turning on the second voltage clamp switch (S4) connected to the low voltage side terminal of the DC power supply to clamp the voltage at the first electrode of the capacitive load to the voltage at the low voltage side terminal of the DC power supply;

(d) a fourth step of turning off the second energy recovery switch (S2) connected to the low voltage side terminal of the DC power supply during a period, during which the first resonant current in the coil (L1) is reversed in direction and a second resonant current is flowing in the reversed direction;

(e) a fifth step of turning on only the second voltage clamp switch (S4) connected to the low voltage side terminal of the DC power supply to clamp the voltage at the first electrode of the capacitive load to the voltage at the low voltage side terminal of the DC power supply;

(f) a sixth step of causing a third resonant current by turning off the first and second voltage clamp switches and by turning on the first energy recovery switch S1 (S3 and S4) to cause the voltage at the first electrode of the capacitive load to rise from the voltage on the low voltage side terminal of the DC power supply to the voltage at the high voltage side terminal of the DC power supply;

(g) a seventh step of turning on the first voltage clamp switch (S3) connected to the high voltage side terminal of the DC power supply to clamp the voltage at the first electrode of the capacitive load to the voltage at the high voltage side terminal of the DC power supply; and (h) an eighth step of turning off the energy recovery switch (S1) connected to the high voltage side side terminal of the DC power supply during a period, during which the third resonant current in the coil (L1) is reversed in direction and a fourth resonant current is flowing in the reversed direction.

3. The capacitive load drive according to claim 1, which further comprises a series Zener diode circuit of two Zener diodes connected in opposite polarities, the series Zener diode circuit being connected in parallel with the capacitor (C3) in series with the coil (L1).

4. The capacitive load drive according to claim 1, which further comprises resistors each in series with each of the diodes in parallel with the respective first and second energy recovery switches.

5. A capacitive load drive for supplying pulses to a capacitive load comprising:

a series circuit of a first coil and a capacitor with one terminal connected to a first electrode of the capacitive load;

a first voltage clamp switch connected to the first electrode of the capacitive load and also connected between one terminal of the series circuit and a high voltage terminal of a DC power supply, a first diode being connected in parallel to the first voltage clamp switch, a second voltage clamp switch connected to the first electrode of the capacitive load and also connected to a low voltage side terminal of the DC power supply; a second diode being connected in parallel to the second voltage clamp switches;

a third diode connected to the other terminal of the series circuit and also connected to the high voltage side terminal of the DC power supply;

a fourth diode connected to the other terminal of the series circuit and also connected to the low voltage side terminal of the DC power supply;

a second coil one terminal of which is connected to the other terminal of the series circuit;

a first energy recovery switch connected to the other terminal of the second coil and the high voltage side terminal of the DC power supply;

a second energy recovery switch connected between the other terminal of the second coil and the low voltage side terminal of the DC power supply; and cathode terminals of the diodes are nearer the high voltage side terminal of the DC power supply.

6. The capacitive load drive for supplying pulses to a capacitive load according to claim 5, wherein pulses are supplied to the reactive load while recovering ineffective energy thereof by repeating:

(a) a first step of turning on only the first voltage clamp switch (S3) connected to the high voltage side terminal of the DC power supply to clamp the voltage at the first electrode of the capacitive load to the voltage at the high voltage side side terminal of the DC power supply;

(b) a second step of causing a first resonant current by turning off all of the clamp switches and turning on the second energy recovery switch (S2) connected to the low voltage side terminal of the DC power supply to cause the voltage at the first electrode of the capacitive load to rise from the voltage at the high voltage side terminal of the DC power supply to the voltage at the low voltage side terminal of the DC power supply;

(c) a third step of turning on the second voltage clamp switch (S4) connected to the low voltage side terminal of the DC power supply to clamp the voltage at the first electrode of the capacitive load to the voltage at the low voltage side terminal of the DC power supply;

(d) a fourth step of turning off the second energy recovery switch (S2) connected to the low voltage side terminal of the DC power supply during a period, during which the first resonant current in the coil (L3) is reversed in direction and a second resonant current is flowing in the reversed direction;

(e) a fifth step of turning on only the second voltage clamp switch (S4) connected to the low voltage side terminal of the DC power supply to clamp the voltage at the first electrode of the capacitive load to the voltage at the low voltage side terminal of the DC power supply;

(f) a sixth step of causing a third resonant current by turning off all of the voltage clamp switches by turning on the first energy recovery switch S1 (S3 and S4) to cause the voltage at the first electrode of the capacitive load to rise from the voltage on the low voltage side terminal of the DC power supply to the voltage at the high voltage side terminal of the DC power supply;

(g) a seventh step of turning on the first voltage clamp switch (S3) connected to the high voltage side terminal of the DC power supply to clamp the voltage at the first electrode of the capacitive load to the voltage at the high voltage side terminal of the DC power supply; and (h) an eighth step of turning off the energy recovery switch (S1) connected to the high voltage side terminal of the DC power supply during a period, during which the third resonant current in the coil (L3) is reversed in direction and a fourth resonant current is flowing in the reversed direction.

7. The capacitive load drive according to claim 1, wherein the voltage clamp switches and the energy recovery switches are field-effect transistors (FETs) or bipolar transistors.

8. The capacitive load drive according to claim 1, wherein the capacitive load is a plasma display panel or an electroluminescent panel.

9. The capacitive load drive according to claim 1, wherein the electrostatic capacitance of the capacitor (C3) is roughly between 2 and 30 times the electrostatic capacitance of the capacitive load.

10. A capacitive load drive for supplying pulses to a capacitive load comprising:

a first parallel circuit including a first diode having a cathode connected to a high voltage side terminal of a DC power supply connected in parallel to a first switch;

a second parallel circuit including a second diode having an anode connected to a lower voltage terminal of the DC power supply connected in parallel to a second switch;

a first series circuit comprising series connection circuit of the first and second parallel circuits;

a third parallel circuit including a third diode having a cathode connected to a high voltage side terminal of a DC power supply connected in parallel to a third switch;

a fourth parallel circuit including a fourth diode having an anode connected to a lower voltage terminal of the DC power supply connected in parallel to a fourth switch;

a second series circuit comprising series connection circuit of the third and fourth parallel circuits;

a third series circuit of a coil and a capacitor connected between the connection points of the first and second series circuits;

wherein the capacitive load is connected between the series connection point of the first series circuit and the cathode of the first diode, the high voltage side terminal of the DC power supply is connected to the cathodes of the first and third diodes, and the lower voltage terminal of the DC power supply is connected to the anodes of the second and fourth diodes.

11. The capacitive load drive according to claim 10, wherein the first and third switches are P-channel FETs and the second and fourth switches are N-channel FETs.

12. The capacitive load drive according to claim 10, wherein two Zener diodes each anode of which is connected together are connected in parallel to the capacitor of the third series circuit.

13. The capacitive load drive according to claim 10, wherein each of the third and fourth diodes has a resistor connected in series with thereto.

14. A capacitive load drive for supplying pulses to a capacitive load comprising:

a first parallel circuit including a first diode having a cathode connected to a high voltage side terminal of a DC power supply connected in parallel to a first switch;

a second parallel circuit including a second diode having an anode connected to a lower voltage terminal of the DC power supply connected in parallel to a second switch;

a first series circuit comprising series connection circuit of the first and second parallel circuits;

a second series circuit of a third diode having a cathode connected to a high voltage side terminal of the DC power supply and a fourth diode having an anode connected to a lower voltage terminal of the DC power supply;

a second series circuit of a third switch and a fourth switch connected between the lower and higher voltage terminals;

a third series circuit of a coil and a capacitor connected between the series connection points of the first and second series circuits;

a coil connected between the series connection points of the second and third series circuits;

wherein the capacitive load is connected between the series connection point of the first series circuit and the cathode of the first diode, the low voltage side terminal of the DC power supply is connected to the cathodes of the first and third diodes and the third switch, and the higher voltage terminal of the DC power supply is connected to the anodes of the second and fourth diodes and the fourth switch.

15. The capacitive load drive according to claim 2, which further comprises a series Zener diode circuit of two Zener diodes connected in opposite polarities, the series Zener diode circuit being connected in parallel with the capacitor (C3) in series with the coil (L1).

16. The capacitive load drive according to claim 2, which further comprises resistors each in series with each of the diodes in parallel with the respective first and second energy recovery switches.

17. The capacitive load drive according to claim 3, which further comprises resistors each in series with each of the diodes in parallel with the respective first and second energy recovery switches.

18. The capacitive load drive according to claim 2, wherein the voltage clamp switches and the energy recovery switches are field-effect transistors (FETs) or bipolar transistors.

19. The capacitive load drive according to claim 3, wherein the voltage clamp switches and the energy recovery switches are field-effect transistors (FETs) or bipolar transistors.

20. The capacitive load drive according to claim 4, wherein the voltage clamp switches and the energy recovery switches are field-effect transistors (FETs) or bipolar transistors.

* * * * *